United States Patent
Hentschel et al.

(10) Patent No.: US 9,802,763 B2
(45) Date of Patent: Oct. 31, 2017

(54) TRANSPORTING DEVICE, PROCESSING ARRANGEMENT AND COATING METHOD

(71) Applicant: VON ARDENNE GmbH, Dresden (DE)

(72) Inventors: Michael Hentschel, Dresden (DE); Hubertus von der Waydbrink, Dresden (DE); Daniel Stange, Dresden (DE); Christoph Dubau, Raeckelwitz (DE); Reinhard Jaeger, Coswig (DE)

(73) Assignee: VON ARDENNE GmbH, Dresden (DE)

( * ) Notice: Subject to any disclaimer, the term of this patent is extended or adjusted under 35 U.S.C. 154(b) by 101 days.

(21) Appl. No.: 14/745,531

(22) Filed: Jun. 22, 2015

(65) Prior Publication Data

US 2015/0368045 A1 Dec. 24, 2015

(30) Foreign Application Priority Data

Jun. 23, 2014 (DE) .................... 10 2014 108 758 U
Oct. 8, 2014 (DE) .................... 10 2014 114 575 U

(51) Int. Cl.
*B65G 35/08* (2006.01)
*B65G 17/06* (2006.01)
(Continued)

(52) U.S. Cl.
CPC ........... *B65G 17/063* (2013.01); *B65G 17/38* (2013.01); *B65G 35/08* (2013.01); *C23C 14/35* (2013.01);
(Continued)

(58) Field of Classification Search
CPC .... B65G 17/06; B65G 17/061; B65G 17/064; B65G 35/08
(Continued)

(56) References Cited

U.S. PATENT DOCUMENTS 2,651,286 A * 9/1953 Oldham .................... A23B 7/16
198/779
2,708,023 A * 5/1955 Cushman ............... B65G 35/00
198/779
(Continued)

FOREIGN PATENT DOCUMENTS

DE 102010061195 A1 6/2011
WO 03031292 A2 4/2003
WO 2011110220 A1 9/2011

OTHER PUBLICATIONS

ASHRAE Handbook, "Fundamentals", 2013, p. 1-2.
(Continued)

*Primary Examiner* — James R Bidwell
(74) *Attorney, Agent, or Firm* — Viering, Jentschura & Partner mbB

(57) ABSTRACT

In various embodiments, a transporting device for transporting a substrate in a process chamber is provided. The transporting device includes a guiding rail arrangement having two guiding rails for mounting a multiplicity of bars between the two guiding rails. The two guiding rails form a closed path of movement along which the multiplicity of bars are guided. The transporting device further includes the multiplicity of bars that are mounted in the guiding rail arrangement, and a drive device for pushing at least one bar of the multiplicity of bars in such a way that, in a transporting region of the guiding rail arrangement, in each case multiple bars of the multiplicity of bars are pushed against one another and the bars that have been pushed against one another move along the path of movement in the transporting region.

7 Claims, 22 Drawing Sheets

(51) Int. Cl.
*C23C 14/35* (2006.01)
*C23C 14/50* (2006.01)
*C23C 16/44* (2006.01)
*C23C 16/458* (2006.01)
*B65G 17/38* (2006.01)

(52) U.S. Cl.
CPC .......... *C23C 14/50* (2013.01); *C23C 16/4401* (2013.01); *C23C 16/4404* (2013.01); *C23C 16/4581* (2013.01)

(58) Field of Classification Search
USPC ........................................ 198/848, 779, 795
See application file for complete search history.

(56) References Cited

U.S. PATENT DOCUMENTS

| | | | | |
|---|---|---|---|---|
| 4,326,626 | A | | 4/1982 | Brockwell |
| 4,526,271 | A | | 7/1985 | Finnighan |
| 5,040,668 | A | * | 8/1991 | Hoppmann ............ B65G 15/00 198/779 |
| 5,069,331 | A | * | 12/1991 | Bartkowiak ........... B65G 15/54 198/848 |
| 5,123,522 | A | * | 6/1992 | Comly, Jr. .............. B65B 61/28 198/779 |
| 7,785,011 | B2 | * | 8/2010 | Reist ........................ B65G 7/04 198/779 |
| 2007/0169630 | A1 | | 7/2007 | Auyoung |
| 2009/0320528 | A1 | | 12/2009 | Skarzenski et al. |
| 2010/0029037 | A1 | | 2/2010 | Tokuda et al. |
| 2011/0131945 | A1 | | 6/2011 | Vauchel et al. |
| 2011/0142746 | A1 | | 6/2011 | Reed et al. |
| 2011/0220467 | A1 | | 9/2011 | Hopfe et al. |
| 2011/0269256 | A1 | | 11/2011 | Black |
| 2012/0164365 | A1 | | 6/2012 | Jang et al. |
| 2012/0180858 | A1 | | 7/2012 | Zhong et al. |
| 2013/0084669 | A1 | | 4/2013 | Black et al. |
| 2014/0116853 | A1 | * | 5/2014 | Chinnock .............. B65G 17/24 198/779 |
| 2014/0159326 | A1 | * | 6/2014 | Copus ...................... B62B 3/02 198/779 |

OTHER PUBLICATIONS

Kipp, "Plastic Material Data Sheets", 2010, p. 1.
RBI Performance Products, "Understanding the Differences Between PBI vs PBO", 2016, p. 1.
ProQuest Translation of WO 03031292 A2, originally published 2003, p. 1-25.
U.S. Final Office Action based on application No. 14/745,540 (40 pages), dated Feb. 27, 2017.
German Search Report based on Application No. 10 2014 114 575.5 (10 pages) dated Mar. 9, 2015 (for reference purpose only).
U.S. Non-Final Office Action based on U.S. Appl. No. 14/745,540 (21 pages) dated Jun. 30, 2016 for reference purpose only).
U.S. Non-Final Office Action based on U.S. Appl. No. 14/745,540 (19 pages) dated Sep. 22, 2016 for reference purpose only).
Ellis, B., Smith, R., "Ploymers—A Property Database", 2009, Taylor and Francis, 2nd Ed., pp. 157-159.
Singha, K., "A Short Review on Basalt Fiber", 2012, International Journal of Textile Science, pp. 19-28.
Ma, Z., Huang, J., Gu, Y., Jin, B., Chen, G., "Thermal Conductivity and Thermal Expansion Properties of Ain/Ep composite", 2012, Tras Tech Publications, pp. 1410-1413.
Kiesewetter, WO 2011/110220, Machine Translation by Espacenet, originally published Sep. 2011, pp. 1-14.
Pinheiro, W., Falcao, V., Cruz, L., Ferreira, C., "Comparative Study of CdTe Sources Used for Deposition of ir . . .,%dTe Thin Films by Close Spaced Sublimation Technique", 2006, Materials Reasearch, 9, pp. 47-49.
Kipp, D., "Plastic Material Data Sheets", 2010, MatWeb, p. 1.

* cited by examiner

TRANSPORTING DEVICE, PROCESSING ARRANGEMENT AND COATING METHOD

CROSS-REFERENCE TO RELATED APPLICATION

This application claims priority to German Patent Application Serial No. 10 2014 108 758.5, which was filed Jun. 23, 2014, and is incorporated herein by reference in its entirety. Furthermore, this application claims priority to German Patent Application Serial No. 10 2014 114 575.5, which was filed Oct. 8, 2014, and is incorporated herein by reference in its entirety.

TECHNICAL FIELD

Various embodiments relate generally to a transporting device, a processing arrangement and a coating method.

BACKGROUND

Generally, various transporting devices can be used in order for example to transport substrates or other carriers in processing installations. For example, substrates can be transported by a transporting device through a vacuum process chamber, a negative pressure process chamber or an atmospheric pressure process chamber, so that the substrates can be processed, for example can be coated, within the vacuum process chamber, the negative pressure process chamber or the atmospheric pressure process chamber.

Furthermore, a coating process may be carried out in a process chamber in such a way that the substrates are coated at a high coating rate (for example at over approximately 1 μm·m/min, for example at over approximately 5 μm·m/min, for example at a coating rate in a range of approximately 1 μm·m/min to approximately 10 μm·m/min), while the substrates pass through the coating region of the process chamber at a predefined transporting speed. In the case of such high-rate coating processes, it is possible for internal components in the process chamber, such as for example the transporting device or parts of the transporting device, to become so thickly coated that the functioning of the internal components, for example the transporting device, may be impaired on account of the undesired coating.

For example, in the case of such high-rate coating processes it is possible for several grams of coating material, for example over 10 g or over 15 g, to be deposited on a substrate or used up in the coating process for one substrate. Consequently, in the course of a lengthy coating procedure, in which for example over 1,000 or over 10,000 substrates are coated one after the other, several kilograms of coating material may be deposited in the process chamber and/or on internal components (for example the transporting device) in the process chambers.

Furthermore, the substrates may be coated with materials that have a low evaporation temperature, for example an evaporation temperature in a range from approximately 500° C. to approximately 1500° C., for example an evaporation temperature in a range from approximately 600° C. to approximately 1400° C., for example an evaporation temperature in a range from approximately 600° C. to approximately 1000° C.

SUMMARY

In various embodiments, a transporting device for transporting a substrate in a process chamber is provided. The transporting device includes a guiding rail arrangement having two guiding rails for mounting a multiplicity of bars between the two guiding rails. The two guiding rails form a closed path of movement along which the multiplicity of bars are guided. The transporting device further includes the multiplicity of bars that are mounted in the guiding rail arrangement, and a drive device for pushing at least one bar of the multiplicity of bars in such a way that, in a transporting region of the guiding rail arrangement, in each case multiple bars of the multiplicity of bars are pushed against one another and the bars that have been pushed against one another move along the path of movement in the transporting region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1A:
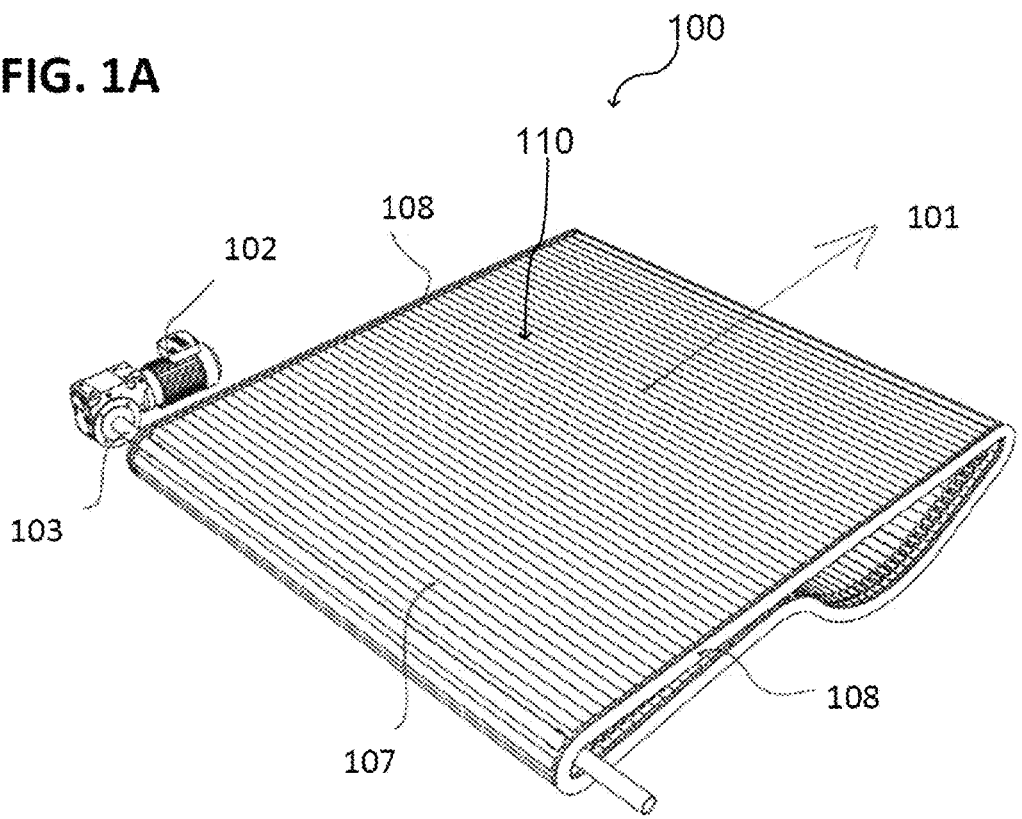
FIGS. 1A to 1U show in each case a transporting device in various schematic views, according to various embodiments.

In the following detailed description, reference is made to the accompanying drawings, which form part of this description and in which specific embodiments in which the invention can be carried out are shown for purposes of illustration. In this respect, directional terminology such as for instance "at the top", "at the bottom", "at the front", "at the rear", "front", "rear", etc. is used with reference to the orientation of the figure(s) described. Since components of embodiments may be positioned in a number of different orientations, the directional terminology serves for purposes of illustration and is in no way restrictive. It goes without saying that other embodiments may be used and structural or logical changes made without departing from the scope of protection of the present invention. It goes without saying that the features of the various embodiments described herein by way of example can be combined with one another, unless otherwise specifically stated. The following detailed description is therefore not to be interpreted in a restrictive sense, and the scope of protection of the present invention is defined by the appended claims.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In the course of this description, the terms "connected" and "coupled" are used for describing both a direct connection and an indirect connection and both a direct coupling and an indirect coupling.

One aspect of this disclosure may be illustratively seen as being that of providing a transporting device that provides a substantially closed transporting surface in a coating region of a process chamber and furthermore can be cleaned in a cleaning region of the process chamber. Furthermore, the transporting device may be set up in such a way that these high temperatures (for example over approximately 600° C., for example over approximately 800° C., for example temperatures in a range from approximately 500° C. to approximately 1500° C.) can be withstood, so that for example substrates can be transported in a coating region of a process chamber or a processing installation even under high thermal loading. Furthermore, the transporting device may be set up in such a way that these high temperatures (for example over approximately 600° C., for example over approximately 800° C., for example temperatures in a range from approximately 500° C. to approximately 1500° C.) can be withstood, so that for example the transporting device can be cleaned in a cleaning region (outside the coating region, for example underneath the coating region) of a process chamber or a processing installation by a heating device (for example coating material deposited on the transporting device can be made to evaporate again).

Furthermore, another aspect of this disclosure may be illustratively seen as being that of providing a transporting device for a coating chamber or coating installation, the transporting device having a simple construction, and consequently for example having a low susceptibility to faults, low maintenance requirement and/or low production costs.

According to various embodiments, a transporting device (for example for transporting a substrate or multiple substrates in a process chamber, for example for transporting a substrate to be coated or multiple substrates to be coated in a coating chamber) may have the following: a guiding rail arrangement with two guiding rails (or guiding structures) for mounting a multiplicity (or plurality) of bars (or a multiplicity of carrier elements) between the two guiding rails. The two guiding rails form a closed path of movement along which the multiplicity of bars are guided (along which all of the bars of the multiplicity of bars are guided); the multiplicity of bars that are mounted in the guiding rail arrangement; a drive device for pushing at least one bar of the multiplicity of bars in such a way that, in a transporting region of the guiding rail arrangement, in each case multiple bars of the multiplicity of bars are pushed against one another and the bars that have been pushed against one another move along the path of movement in the transporting region.

According to various embodiments, the bars may at least in certain regions have been pushed or be pushed against one another without any gaps.

Figure 1B:
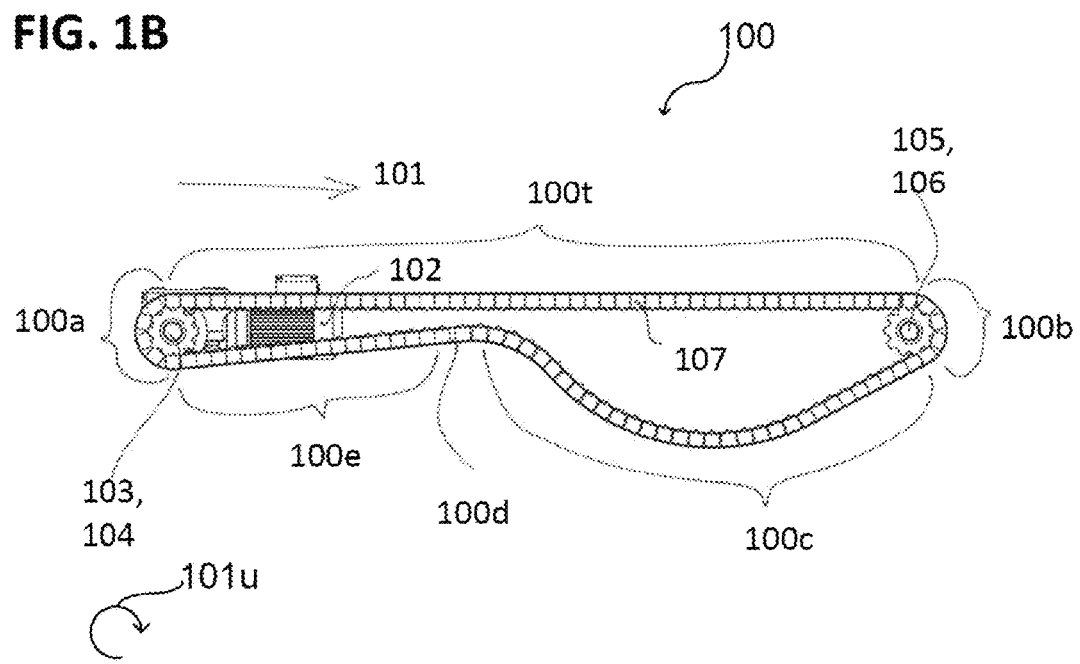

Illustratively, the two guiding rails of the guiding rail arrangement can define a closed path of movement and the multiplicity of bars can be moved (pushed) along the path of movement along a circumferential direction $101u$ (cf. FIG. 1B). In this case, the guiding rail arrangement may be completely filled with the bars (apart from a tolerance), so that it may be sufficient to push one bar or only a few bars against one another in order to push the preceding bars further as a closed surface in the transporting region (for example in a processing region or in a coating region). According to various embodiments, the bars may not be physically connected to one another, but in each case mounted individually in the guiding rail arrangement. Furthermore, the bars may be shaped in such a way that in each case multiple bars of the multiplicity of bars form a closed substrate support, at least in the processing region or coating region of a process chamber.

According to various embodiments, the guiding rails may be provided or be provided in each case in one piece; or be assembled or be assembled from multiple segments. Illustratively, the guiding rails may be structurally adapted in each case in such a way that a predefined closed path of movement is provided by the guiding rails.

Furthermore, each bar of the multiplicity of bars may have a rotatably mounted roller in each case at two end portions lying opposite one another, wherein the guiding rail arrangement may be set up in such a way that the bars of the multiplicity of bars are in each case mounted with the rotatably mounted rollers in the guiding rail arrangement.

Furthermore, in the transporting region of the guiding rail arrangement, the guiding rails may run in a straight line. Consequently, for example, the multiplicity of bars can form a closed (e.g. planar) transporting surface (substrate support) in the transporting region of the guiding rail arrangement. In order to achieve a series arrangement without gaps, the guiding rails may in each case have a sliding piece.

According to various embodiments, the guiding rail arrangement may have a returning region, in which the bars of the multiplicity of bars in each case move along the path of movement, a first direction of movement of the respective bars in the returning region being directed counter to the direction of movement of the respective bars in the transporting region. Illustratively, in the transporting region, the bars can for example be pushed along a straight transporting section. A substrate that lies on the bars in the transporting region is likewise transported along the transporting direction. In the returning region, the bars can then be correspondingly pushed from the end of the transporting section back again to the beginning of the transporting section, counter to the transporting direction, outside the transporting region. The transporting region may for example be set up above the returning region.

Illustratively, the path of movement may have a transporting portion and a returning portion. For example, the path of movement, defined by the guiding rail arrangement, may be straight in the upper strand (also referred to as the load strand) and run in a curved manner in the lower strand (also referred to as the empty strand).

Furthermore, the two guiding rails may be curved in the returning region of the guiding rail arrangement, for example curved in a c shape or curved in an S-shape or have some other desired curved profile.

Furthermore, the two guiding rails may be set up in the returning region in such a way that the path of movement runs in a curved manner, for example curved in a c shape or curved in an S-shape or have some other desired curved profile.

According to various embodiments, a guiding rail may for example also be provided as a corresponding clearance in a wall element. According to various embodiments, the two guiding rails of the transporting device 100 may be set up in the returning region 100r in such a way that the guiding rail arrangement provides a curved path of movement in the returning region 100r.

Furthermore, the drive device may have at least one chain wheel (for example two chain wheels). Furthermore, each bar of the multiplicity of bars may have at least one engagement or engaging portion (for example two engagements or two engaging portions) for the at least one chain wheel (for example for two chain wheels) in such a way that each bar of the multiplicity of bars can be coupled with the drive device. For example, each of the bars may have at least one pin, which can engage in the at least one chain wheel. Furthermore, each of the bars may have at least one pin. Furthermore, a rotatable sleeve may have been pushed onto the pin, so that the rotatable sleeve can engage in the at least one chain wheel. In this way it is possible for example to prevent a torque being transferred to the bars during the driving of the respective bars (during the pushing together of the respective bars by the at least one chain wheel). In this way it is possible for example to prevent tilting and/or canting of the bars.

Furthermore, each bar of the multiplicity of bars may include carbon-fiber-reinforced carbon and/or a ceramic or consist of carbon-fiber-reinforced carbon and/or a ceramic. In this way the transporting device can have a high thermal stability, for example the bars can be heated up to over approximately 500° C., for example to approximately 1500° C., without the functional capability of the transporting device being affected.

According to various embodiments, each bar of the multiplicity of bars may be set up in a cuboidal form. According to various embodiments, each bar of the multiplicity of bars may have a U profile in cross section.

According to various embodiments, a processing arrangement may include the following: a process chamber (for example a coating chamber) for processing (for example for coating) a substrate (or multiple substrates) within a processing region (for example within a coating region) of the process chamber. The process chamber may further include a cleaning region for cleaning at least part of a transporting device, a transporting device arranged between the processing region and the cleaning region. The transporting device may have a carrier structure for carrying and transporting a substrate in the processing region. The transporting device may be set up in such a way that the carrier structure can be moved through the cleaning region; and a cleaning device for cleaning the carrier structure in the cleaning region.

Furthermore, the transporting device may have at least two deflecting rollers. The carrier structure may also be set up as a transporting belt, which has been tensioned between the at least two deflecting rollers. Furthermore, the transporting belt may have been tensioned or be tensioned between the at least two deflecting rollers by a tensioning device.

According to various embodiments, the transporting device may have two continuously circulating chains (wherein the continuously circulating chains are for example in each case tensioned between at least two chain wheels). A multiplicity of carrier rods may be set up between the two continuously circulating chains in such a way that the carrier rods can move along a closed path of movement by being driven by the chain drive (the carrier rods may for example have been fastened by their opposite end portions in each case to the continuously circulating chains). The carrier structure may be set up as a transporting belt that has been tensioned over the multiplicity of carrier rods. Furthermore, the transporting belt may have been tensioned or be tensioned between the multiplicity of carrier rods by a tensioning device.

Furthermore, the transporting belt may include a woven fabric, which may include fabric fibers of at least one material from the following group of materials: carbon, graphite, glass, quartz glass, polyamide, aramid. In this way, the transporting belt can have a high thermal stability, for example the transporting belt can be heated up to over approximately 500° C., for example to approximately 1500° C., without the functional capability of the transporting device being affected.

Furthermore, the transporting device may have a chain drive. The carrier structure may furthermore have multiple carrier elements coupled to the chain drive.

According to various embodiments, the carrier elements may be set up in such a way that they form a closed transporting surface (a closed substrate support) for the placing on and transporting of a substrate in the processing region.

According to various embodiments, the transporting device may have two continuously circulating chains (wherein the continuously circulating chains have for example in each case been tensioned between at least two chain wheels). A multiplicity of carrier elements (slats) may be set up between the two continuously circulating chains in such a way that the carrier elements (slats) can move along a closed path of movement by being driven by the chain drive (the slats may for example have been fastened by their opposite end portions in each case to the continuously circulating chains). According to various embodiments, the slats may be set up in such a way that they form a closed transporting surface (a closed substrate support) for the placing on and transporting of a substrate in the processing region.

Furthermore, the multiple carrier elements may include carbon-fiber-reinforced carbon and/or a ceramic or essentially consist of carbon-fiber-reinforced carbon and/or a ceramic. In this way, the multiple carrier elements can have a high thermal stability, for example the multiple carrier elements can be heated up to over approximately 500° C., for example to approximately 1500° C., without the functional capability of the transporting device being affected.

Furthermore, the transporting device may have two guiding rails and the carrier structure may furthermore have multiple bars. The two guiding rails may be set up in such a way that the multiple bars can be mounted between the two guiding rails and can be guided along a closed path of movement.

Furthermore, the multiple bars may include carbon-fiber-reinforced carbon and/or a ceramic or essentially consist of carbon-fiber-reinforced carbon and/or a ceramic. In this way the transporting device can have a high thermal stability, for example the bars can be heated up to over approximately 500° C., for example to approximately 1500° C., without the functional capability of the transporting device being affected.

Furthermore, the cleaning device may have a heater or radiant heater for heating up the carrier structure in the cleaning region.

According to various embodiments, the processing arrangement may also have at least one coating device for coating the substrate transported by the carrier structure of the transporting device in the coating region.

According to various embodiments, the processing arrangement may have at least one feed for introducing gaseous coating material into the coating region of the processing arrangement, so that a substrate transported by the carrier structure of the transporting device can be coated in the coating region.

According to various embodiments, a coating method for coating a substrate in a process chamber may include the following: transporting the substrate by a transporting device through a coating region within the process chamber, coating the substrate transported by the transporting device within the coating region by a coating device; cleaning at least part of the transporting device in a cleaning region of the process chamber by a cleaning device.

Furthermore, the transporting of the substrate may take place by a carrier structure of the transporting device. The transporting device and the carrier structure may be set up in the way described above.

Furthermore, the cleaning may include irradiating the transporting device in the cleaning region by a radiant heater.

Furthermore, the irradiation of the transporting device may take place in such a way that at least a region of the transporting device is heated up to a temperature of over 500° C.

According to various embodiments, the substrate may be transported in the coating region by the transporting region of the transporting device. Furthermore, the transporting device may be cleaned in its returning region.

Generally, substrates or carriers can be processed (treated) by various processing installations (processing arrangement). In this respect, a processing installation may be set up in such a way that a substrate can for example be coated, heated, cooled, etched, exposed to light, structured and/or treated in some other way. The treatment (processing) of substrates may take place for example in a vacuum (in a vacuum process chamber), at normal pressure (standard pressure or atmospheric pressure in an atmospheric pressure process chamber) or under positive pressure (in a positive pressure process chamber). For coating (vapor coating) a substrate, a coating device that has been set up in such a way that a sputtering process (cathode sputtering process) can be carried out by the coating device may be used for example. Sputtering processes may be carried out in various ways, for example as direct-current (DC) sputtering, medium-frequency (MF) sputtering, high-frequency (HF) sputtering, in each case using one or more cathodes (targets), using a magnet system (magnetron sputtering), using a reactive gas as reactive sputtering, as high-power pulsed sputtering and/or the like. Furthermore, at least one of the following types of coating may be used for example for the coating (vapor coating) of a substrate or a carrier: chemical gas phase deposition, physical gas phase deposition, thermal evaporation, electron beam evaporation, depositing a material with a low evaporation temperature (for example less than 800° C., for example less than 700° C., for example less than 600° C., for example less than 500° C., for example less than 400° C., for example less than 300° C.) from the gas phase, wherein the material is provided by a carrier gas in the process chamber.

Furthermore, a substrate can be transported through a process chamber of a processing arrangement by a transporting device. The substrate can be processed in a processing region of the process chamber. The transporting of substrates of a flat form may take place conventionally directly by transporting rollers, or the substrates (for example wafers) may be transported conventionally by substrate carriers (known as carriers). Substrates in strip form may be conventionally transported for example directly from roller to roller and/or by multiple deflecting rollers in the process chamber.

According to various embodiments, a transporting device by which a substrate or a carrier can be transported through a process chamber of a processing arrangement is provided. The transporting device can form a closed transporting surface (substrate support), so that coating material in the gas phase cannot pass through the closed transporting surface of the transporting device, or only in insubstantial amounts. In this way it is possible for example to bound a coating region in a process chamber effectively in the downward direction by the transporting device. Furthermore, the transporting device may be set up in such a way that, at each point in time during the operation of the transporting device, a fixed planar transporting level is provided, along which a substrate (for example a substrate in sheet form, for example a glass substrate in sheet form, for example a semiconductor substrate in sheet form) or else multiple substrates can be transported.

Figure 1C:
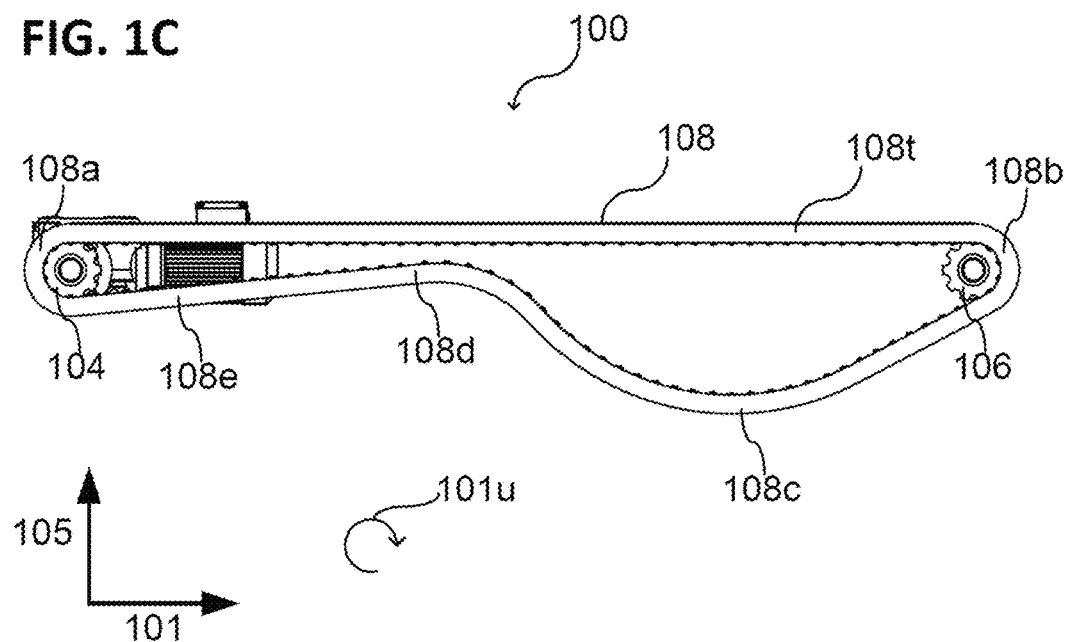
Figure 1D:
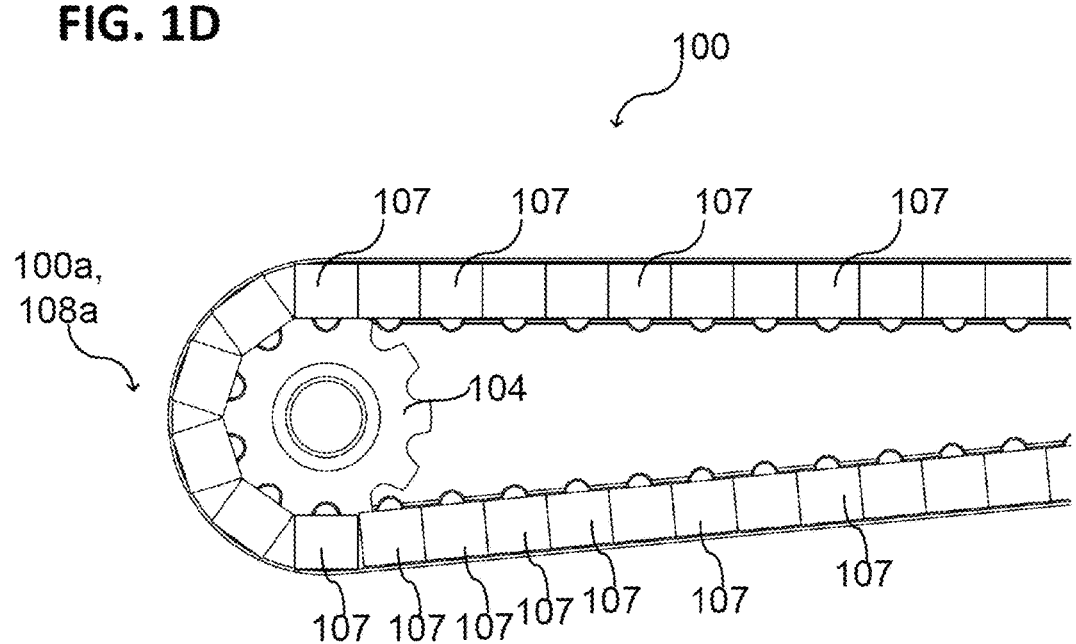
Figure 1E:
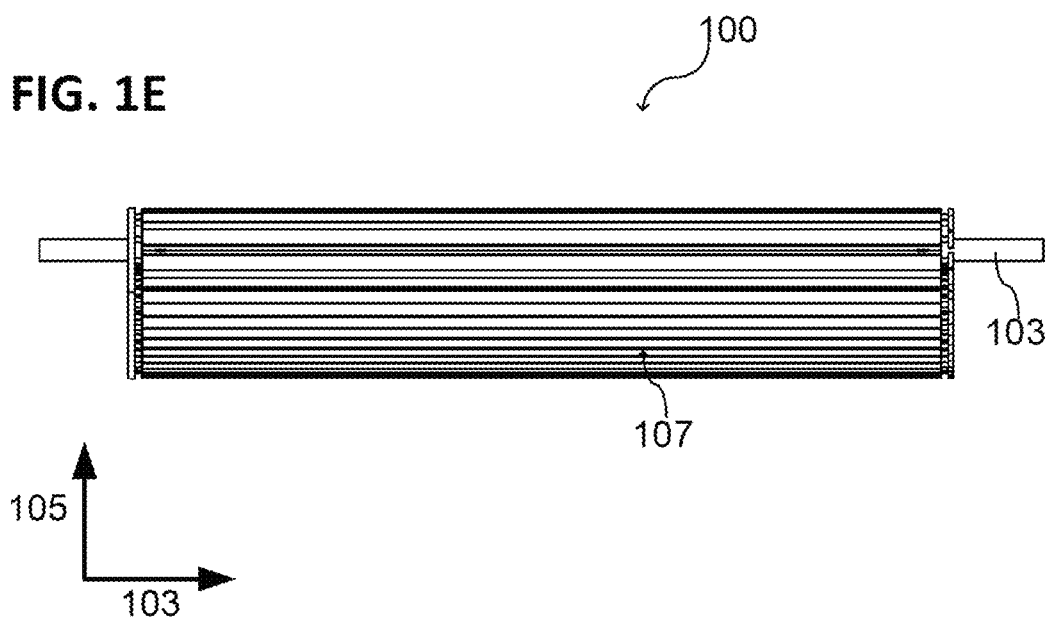
Figure 1F:
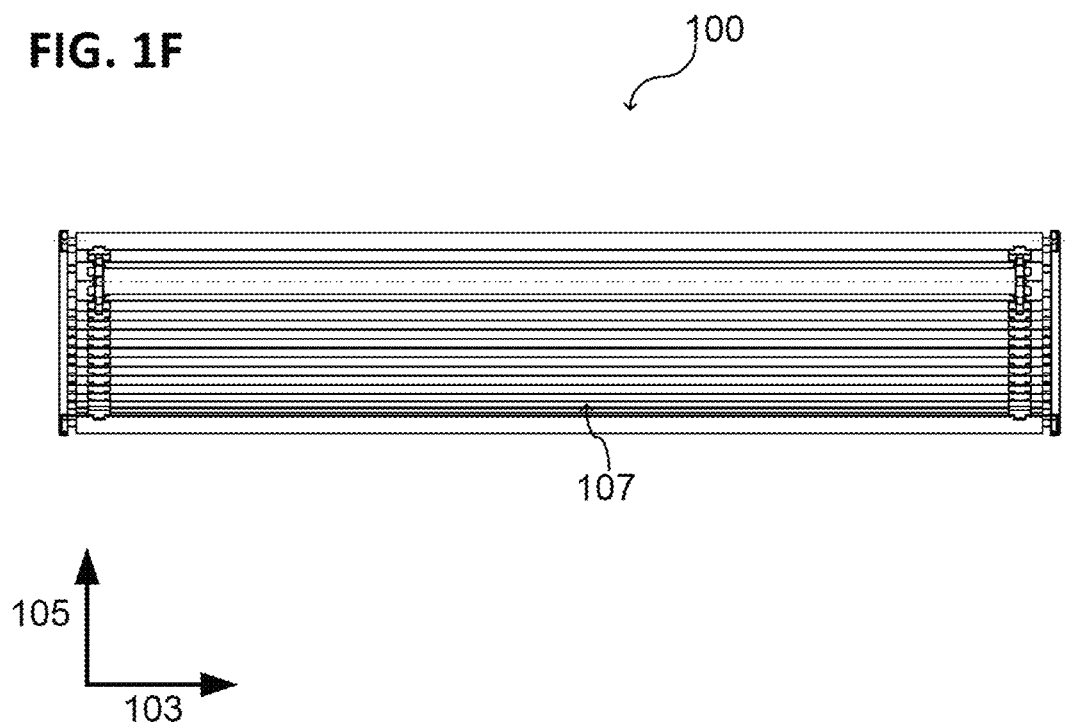
Figure 1G:
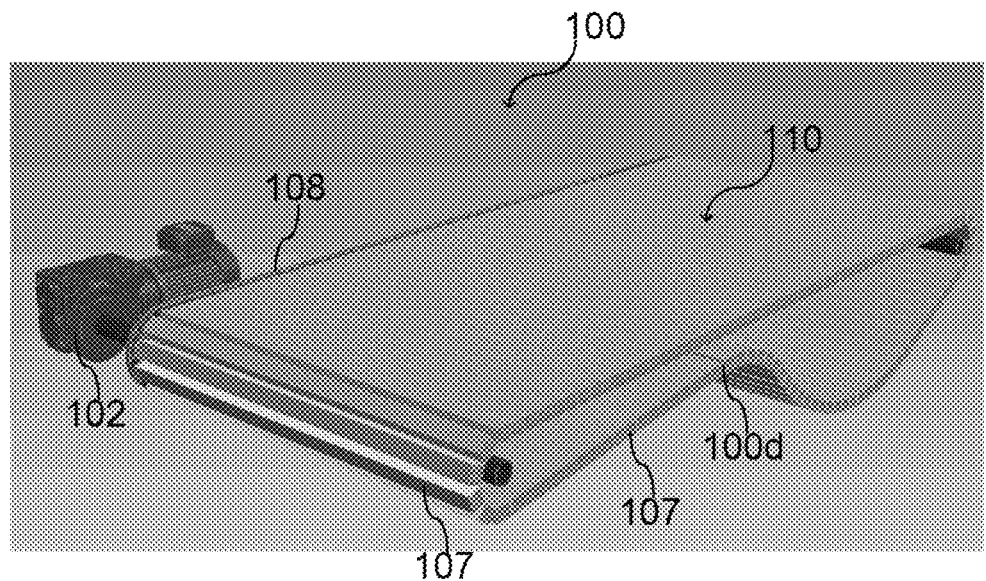
Figure 1H:
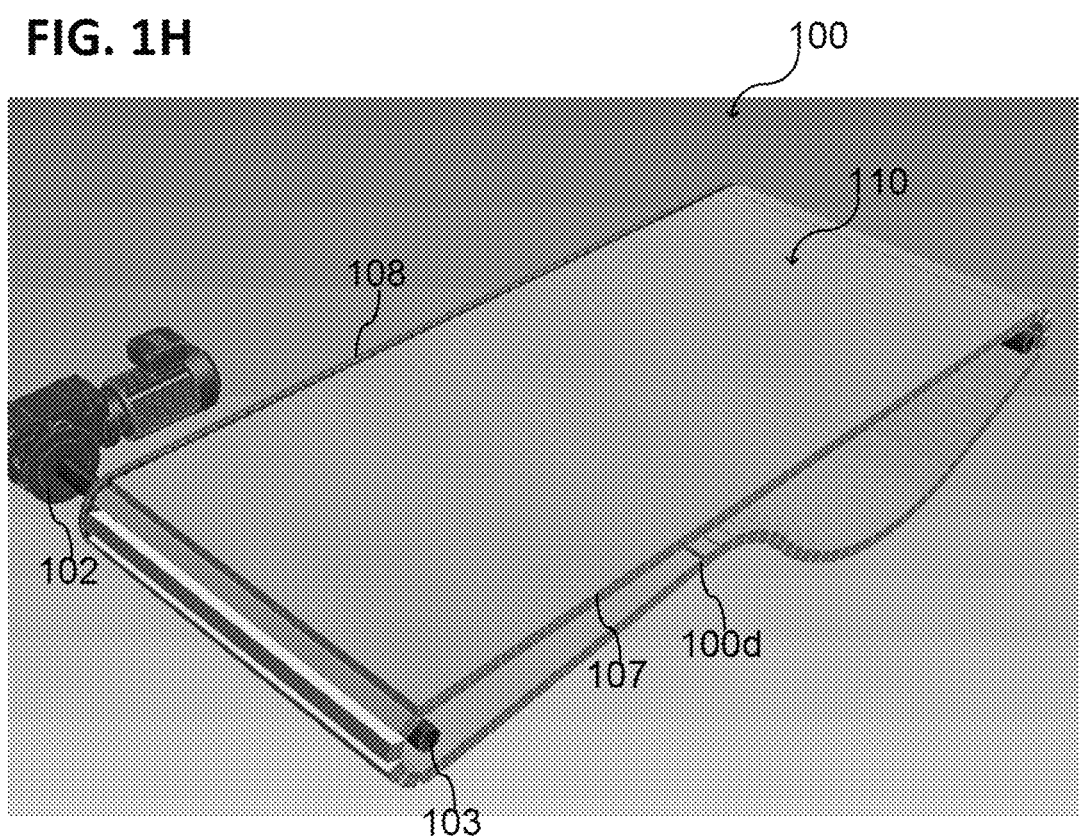
Figure 1I:
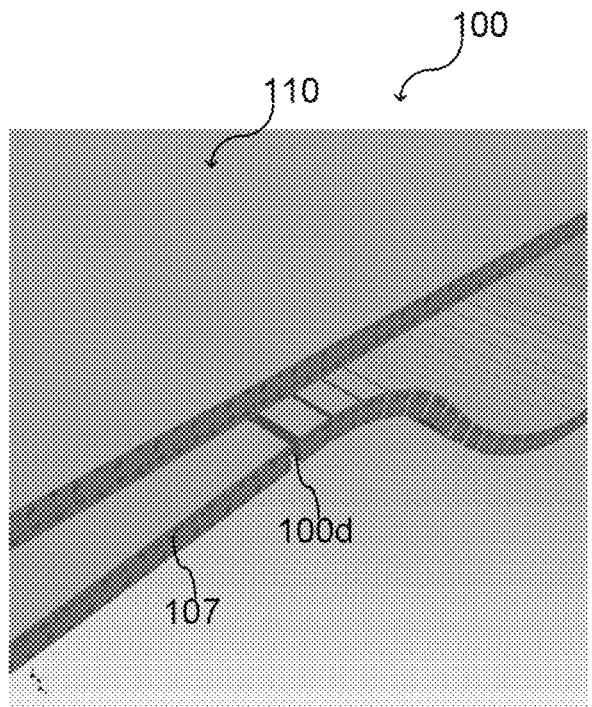
Figure 1J:
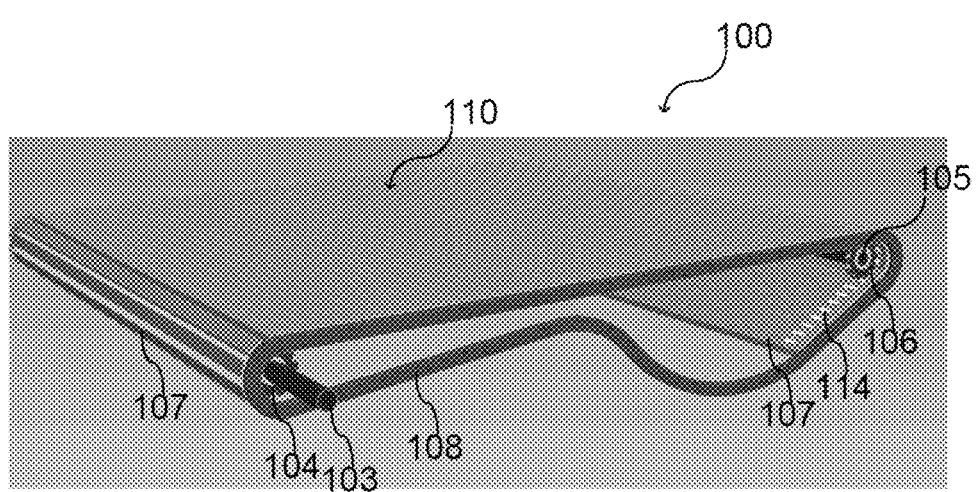
Figure 1K:
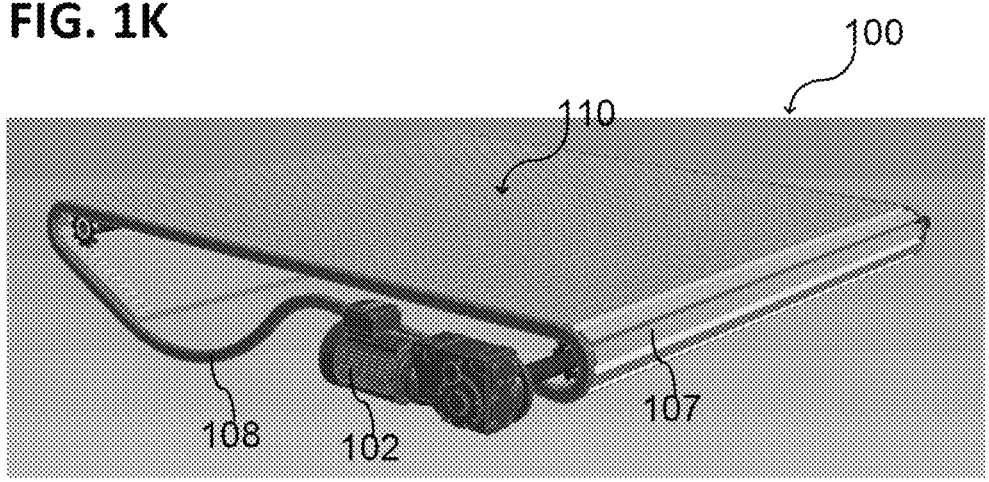
Figure 1L:
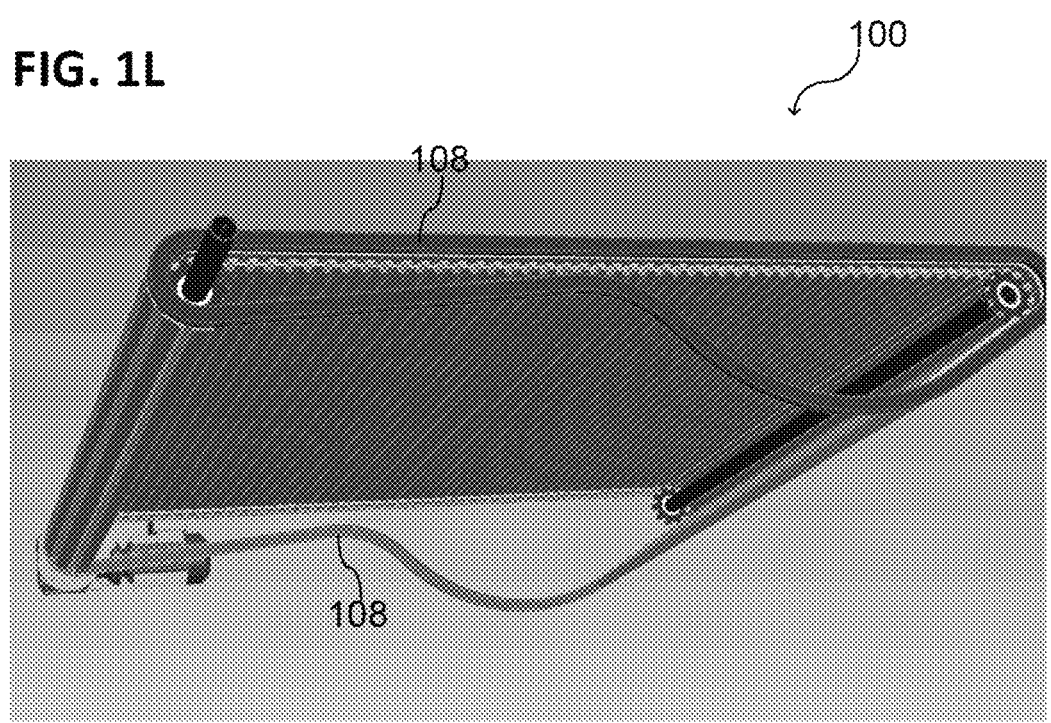
Figure 1M:
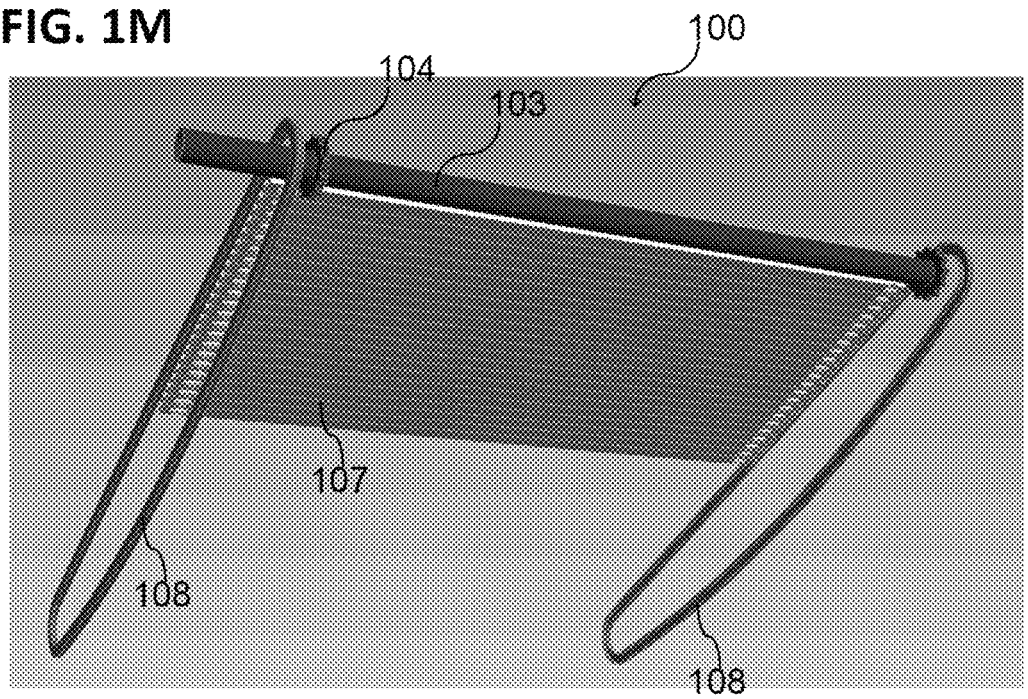
Figure 1N:
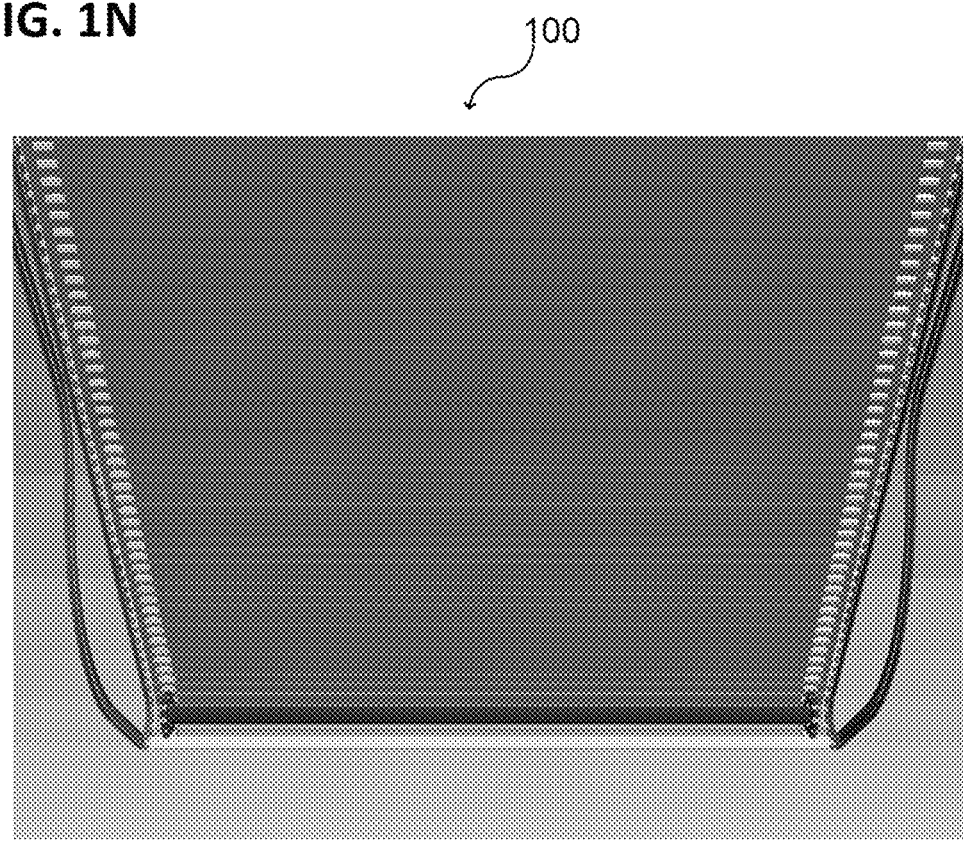
Figure 1O:
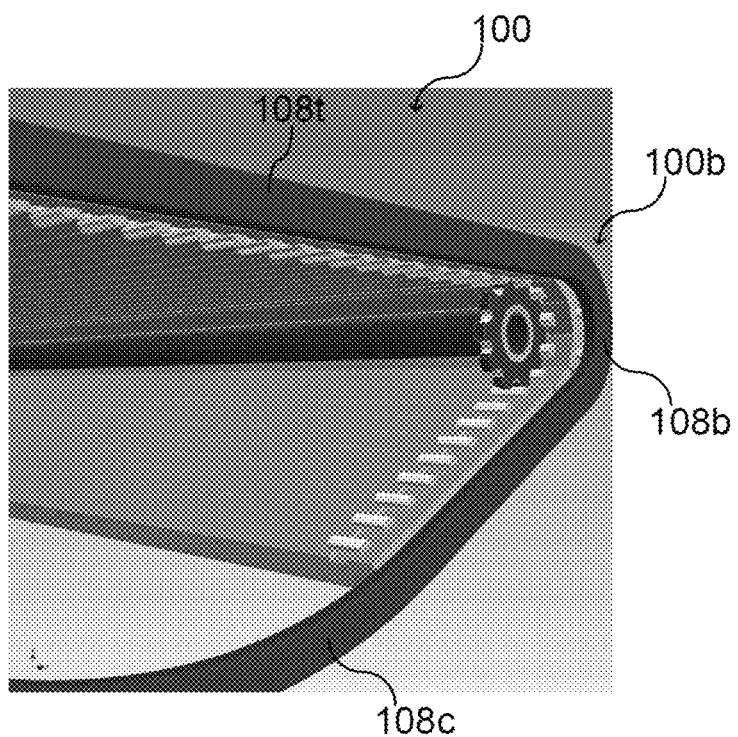
Figure 1P:
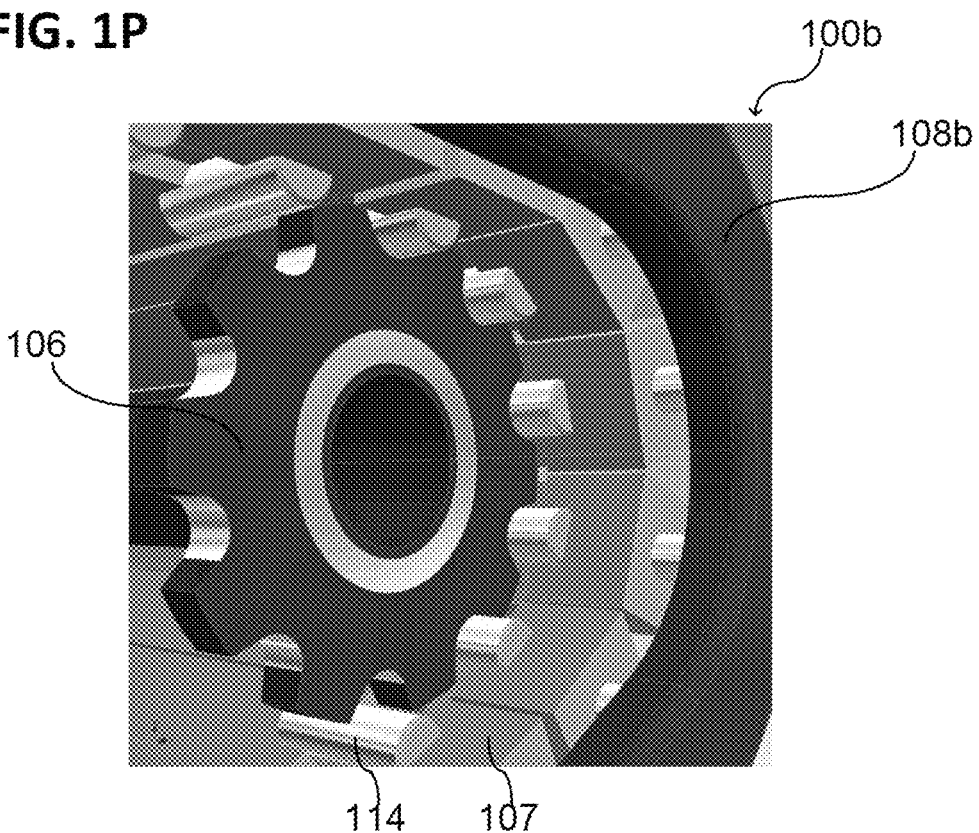
Figure 1Q:
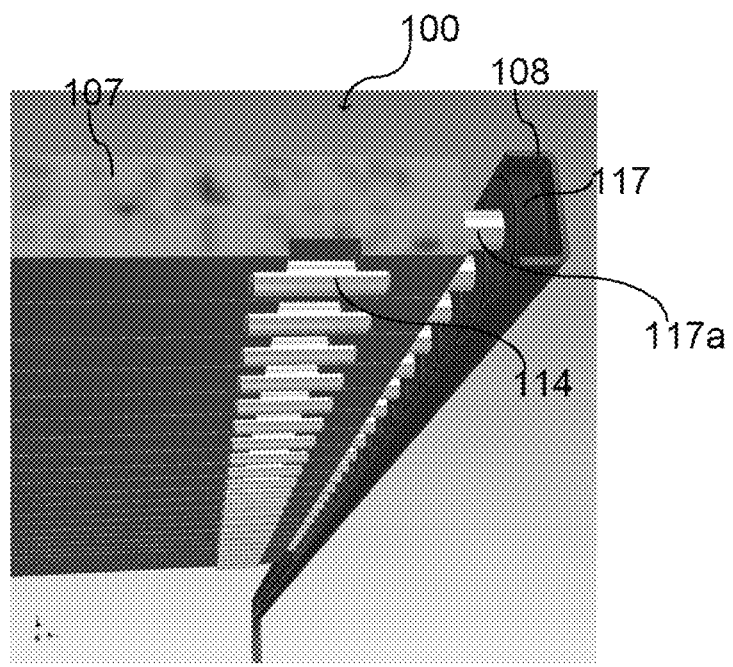
Figure 1R:
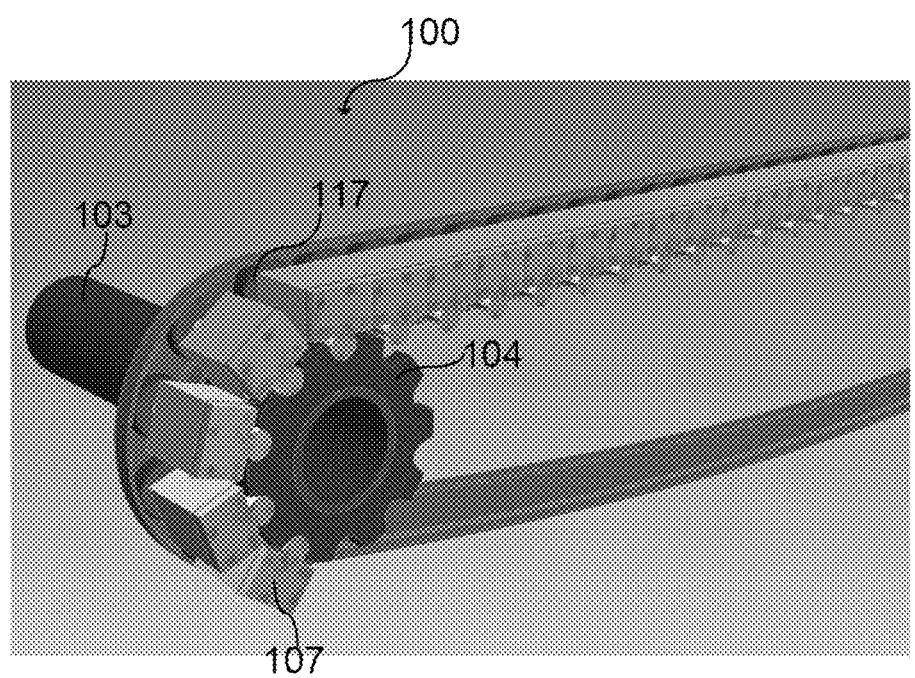
Figure 1S:
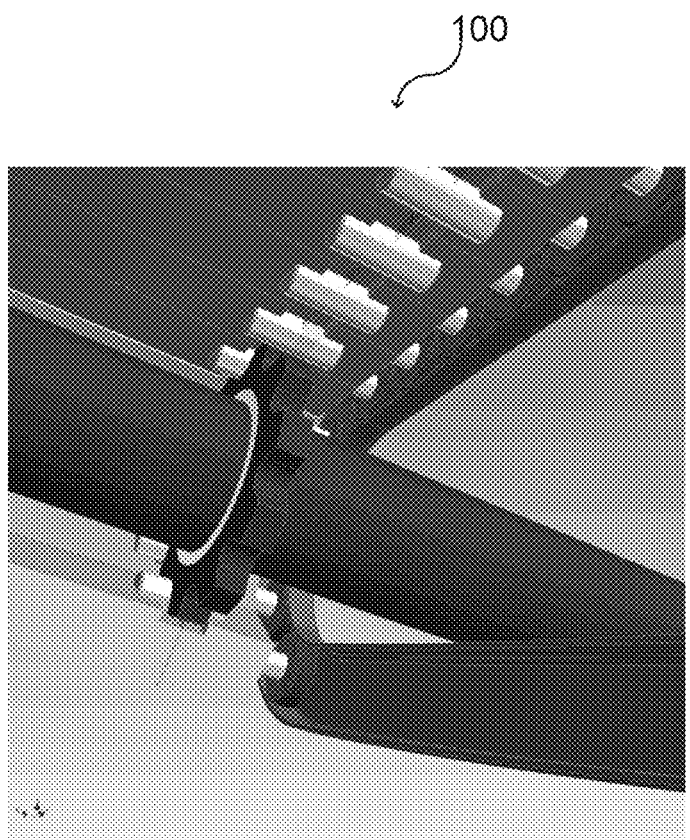
Figure 1T:
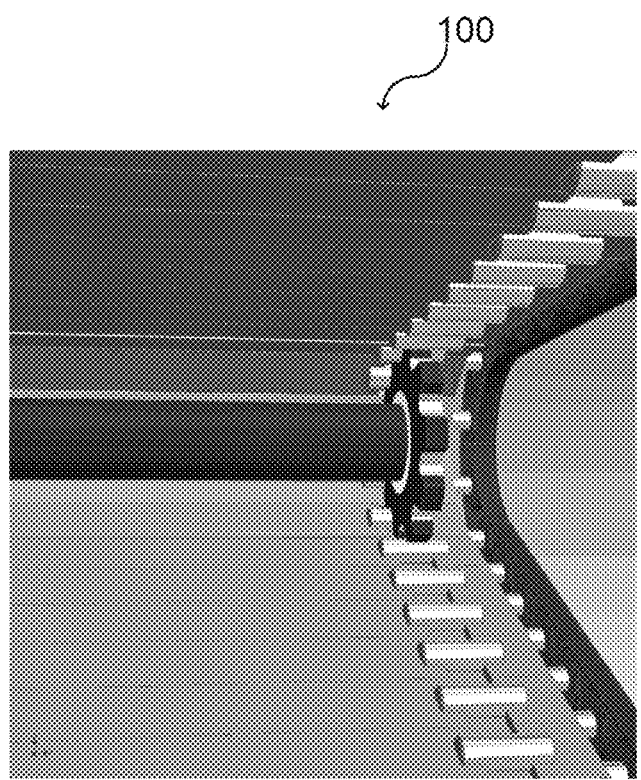
Figure 1U:
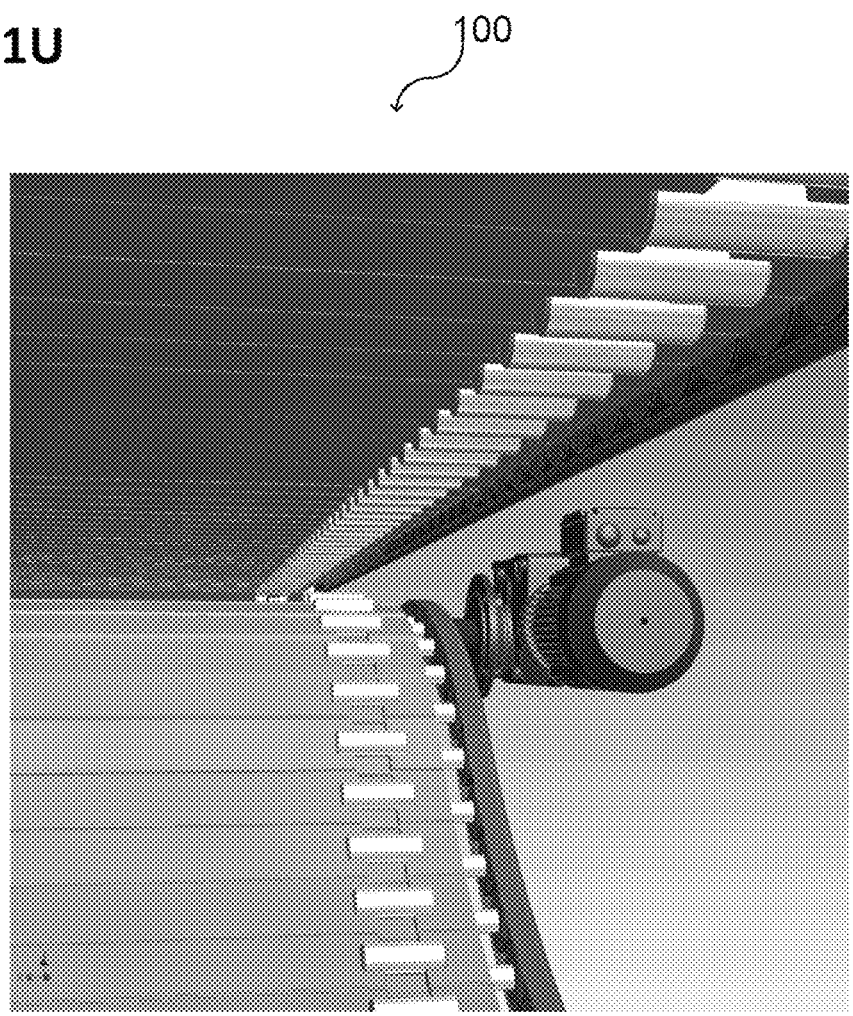

In FIG. 1A to FIG. 1U, a transporting device 100 (a conveyor or a bar conveyor for transporting substrates) is in each case illustrated in various perspective views and also side views and cross-sectional views and representations of details, according to various embodiments.

FIG. 1A illustrates a transporting device 100 in a schematic view, according to various embodiments. The transporting device 100 may for example have a guiding rail arrangement, with two guiding rails 108 for mounting a multiplicity of bars 107 (transporting bars 107). In this case, the two guiding rails 108 may be aligned substantially parallel to one another and arranged at a distance in such a way that the bars 107 can be mounted between the two guiding rails 108.

According to various embodiments, the two guiding rails 108 form a closed path of movement along which the bars 107 can be guided. In this case, each bar 107 can be moved along the closed path of movement in the guiding rails 108. The bars 107 may have been mounted in each case at their opposite end portions in the guiding rails 108 of the guiding rail arrangement.

According to various embodiments, the transporting device 100 may have a drive device for pushing (driving) at least one bar of the multiplicity of bars (107) in such a way that, in a transporting region 100t of the guiding rail arrangement, in each case multiple bars of the multiplicity of bars are pushed against one another and the bars that have been pushed against one another in the transporting region 100t move along the path of movement. Illustratively, the bars pushed against one another in the transporting region 100t can form a closed transporting surface.

According to various embodiments, the drive device may have a motor 102, by which a torque can be transferred to a drive shaft 103, wherein the bars 107 can be pushed along the path of movement by the drive shaft 103. For this purpose, at least one chain wheel 104 (or multiple chain wheels 104, for example two chain wheels 104) may have been provided on the drive shaft 103, and in each of the bars 107 there may be set up at least one engagement 114 correspondingly matching the at least one chain wheel 104 (cf. for example FIG. 1P), so that the bars 107 can be pushed (pushed further) along the path of movement by the at least one chain wheel 104. In the transporting region 100*t*, the bars 107 may accumulate in such a way that the bars 107 lie closely against one another and provide a closed support for transporting a substrate on the closed support.

Illustratively, each bar 107 can move in a circulating direction 101*u* along the path of movement in the guiding rail arrangement, for example roll in the guiding rails 108. The circulating direction 101*u* may be defined by the transporting direction 101 in which a substrate is to be transported in a transporting region 100*t* of the guiding rail arrangement. In the transporting region 100*t*, the bars 107 can form a closed structure, on which a substrate can lie and be transported along the transporting direction 101.

According to various embodiments, a substrate of a flat form can be transported horizontally in the transporting direction 101 by the transporting device 100. In this case, a transporting speed of up to approximately 10 m/min, for example up to approximately 6 m/min, may have been provided or be provided by the transporting device 100.

Furthermore, the material for the transporting device 100 may be chosen such that temperatures of 800° C. can prevail in the transporting region 100*t* without the transporting device 100 being impaired or damaged.

For example, a substrate of a flat form can lie on a number of the transporting bars 107. The transporting bars 107 may for example have been produced from carbon-fiber-reinforced carbon (CFC) or a ceramic material.

According to various embodiments, the transporting device 100 may be set up in such a way that for example the respectively neighboring transporting bars 107 do not have any mechanical connection between one another. The transporting bars 107 may for example just be guided in the guiding rails 108. The transporting movement may take place by a transporting bar 107 being pushed against the preceding transporting bar 107, for example driven by way of the drive motor 102, the drive shaft 103 and the chain wheels 104 arranged for example on both sides of the drive shaft 103.

Illustratively, this procedure (manner of driving and mounting the transporting bars 107) does not cause any gaps between the transporting bars 107 in the transporting region 100*t*. In other words, a closed supporting surface 110 for placing on substrates is produced in the transporting region 100*t* of the transporting device 100. The substrate to be transported may for example lie flat on the supporting surface 110 in the transporting region 100*t*.

FIG. 1B illustrates the transporting device 100 in a schematic cross-sectional view, according to various embodiments.

According to various embodiments, the transporting device 100 may have various regions (conveying regions). The transporting bars 107 pass these various regions in the circulating direction 101*u* along the closed path of movement. According to various embodiments, in a driving region 100*a*, the transporting bars 107 can be pushed (in a non-reversing manner) in the circulating direction 101*u* along the closed path of movement by the drive shaft 103 and the two chain wheels 104. In the transporting region 100*t* (the pushing/conveying region 100*t*), the pushed transporting bars 107 may have been guided or be guided in a straight line, so that a corresponding substrate transporting level is provided in the transporting region 100*t*.

Furthermore, in a deflecting region 100*b* (defined by the path followed by the guiding rails 108) after the transporting region 100*t*, a pushing deflection may take place by a non-driven deflecting shaft 105 and for example two chain wheels 106. According to various embodiments, the pushing deflection in the deflecting region may serve for the uniform deflection of the transporting bars 107. Furthermore, the pushing deflection may also take place without the deflecting shaft 105 and the chain wheels 106, exclusively by the guiding rails 108.

Furthermore, in a sagging pushing/conveying region 100*c* (defined by the path followed by the guiding rails 108) after the deflecting region 100*b*, a cleaning of the transporting bars 107 may take place. For example, the transporting bars 107 may be cleaned thermally (by re-evaporation of the coating material deposited on the transporting bars 107) or mechanically. According to various embodiments, the transporting device 100 may be set up or the guiding rails 108 may be shaped in such a way that the transporting bars 107 in the sagging pushing/conveying region 100*c* are moved on a curved path of movement, so that for example gaps open up between the individual neighboring transporting bars 107, and consequently a greater area of attack is provided for the cleaning of the transporting bars 107.

According to various embodiments, the transporting device 100 may have a tolerance region 100*d* (or the guiding rail arrangement may have a tolerance region 100*d*), by which allowance can be made for example for a thermal change in length and/or various production tolerances. In a way corresponding to the tolerance region 100*d*, a sloping driven region 100*e* may have been provided in such a way that a slight build-up of the transporting bars 107 can take place directly before the driven chain wheels 104.

According to various embodiments, the transporting bars 107 may be pushed in the transporting region 100*t* from the driving region 100*a* to the deflecting region 100*b*, along the transporting direction 101, and moved in the returning region 100*c*, 100*d*, 100*e* from the deflecting region 100*b* to the driving region 100*a* again, counter to the transporting direction 101.

Alternatively, the guiding rail arrangement may be set up in such a way that the transporting bars 107 are also transported in a straight line or along a simply curved path of movement, for example along a C-shaped path of movement, in the returning region 100*c*, 100*d*, 100*e*.

According to various embodiments, the cleaning of the transporting bars 107 may take place in the returning region 100*c*. For example, the transporting bars 107 may be heated up in a first part 100*c* of the returning region and the transporting bars 107 may be cooled down or re-emit the heat absorbed in a further part 100*d*, 100*e* of the returning region.

According to various embodiments, from the driving region 100*a* to the tolerance region 100*d*, the multiplicity of transporting bars 107 may be pushed while lying against one another, and after the tolerance region 100*d* they may gather again in the sloping driven region 100*e* to be pushed once again into the driving region 100*a*.

FIG. 1C illustrates the transporting device 100 in a schematic side view, according to various embodiments. As shown in FIG. 1C, the guiding rail 108 may provide the various regions in each case of the transporting device 100. By analogy with the foregoing description, the guiding rail 108 (or the guiding rail arrangement) may have or provide the following regions: a driving region 108*a*, a transporting region 108*t*, a deflecting region 108*b*, a sagging pushing/conveying region 100*c*, a tolerance region 100*d* and a sloping driven region 100*e*. In this case, the transporting bars 107 move through the various regions of the guiding rail 108 (or the guiding rail arrangement) according to the circulating direction 101*u*.

FIG. 1D illustrates the driving region 100*a*, 108*a* of the transporting device 100 in a view of a detail, according to various embodiments. According to various embodiments, the transporting bars 107 lie closely against one another after being pushed together in the driving region 100*a*, 108*a*. Illustratively, the transporting device 100 provides a substantially gas-impermeable transporting area 110 on the upper side of the transporting device 100.

FIG. 1E shows the transporting device 100 in a side view along the transporting direction 101 and FIG. 1F shows the transporting device 100 in a side view counter to the transporting direction 101, according to various embodiments. According to various embodiments, the transporting device 100 may have a maximum overall height along the height direction 105 (along the vertical direction 105) in a range from approximately 10 cm to approximately 100 cm, for example an overall height in a range from approximately 20 cm to approximately 100 cm. According to various embodiments, the transporting device 100 may have a width along the width direction 103 (along the horizontal direction 103) in a range from approximately 50 cm to approximately 600 cm, for example in a range from approximately 50 cm to approximately 300 cm, for example in a range from approximately 50 cm to approximately 200 cm.

Furthermore, the transporting device 100 is illustrated in FIGS. 1G and 1*n* FIG. 1H, in each case in a perspective sectional view, according to various embodiments.

FIG. 1I illustrates a view of a detail of the tolerance region 100*d* of the transporting device 100, according to various embodiments. Only the transporting bars 107 that are arranged along the path of movement, as described above, are shown.

FIG. 1J illustrates the transporting device 100 in a perspective view, according to various embodiments, as described above. It is also shown how the chain wheels 104, 106 engage in the corresponding engagements 114 in the transporting bars 107. In this case, the shaft 103 may be driven, and the further shaft 105 may for example be set up in a passive, co-running manner.

Furthermore, the transporting device 100 is illustrated in FIG. 1K, FIG. 1L, FIG. 1M and FIG. 1N, in each case in a perspective view, according to various embodiment. By way of example, a transporting device 100 with a C-shaped returning region of the guiding rails 108 is illustrated in FIG. 1M.

FIG. 1O and FIG. 1P illustrate the deflecting region 100*b* of the transporting device 100 in a perspective view of a detail, according to various embodiments, and also the engagement of a chain wheel 106 in the transporting bars 107. According to various embodiments, each transporting bar 107 may have at least one pin, which can engage in the at least one chain wheel 106. According to various embodiments, the chain wheel 106 may not be driven in the deflecting region 100*b*. In other words, the chain wheel 106 may be set in a rotating movement by the transporting bars 107 that are pushed past. The chain wheel 106 in the deflecting region 100*b* may for example facilitate the movement of the transporting bars 107 along the curvatures in the guiding rails 108, for example prevent canting of the transporting bars 107.

Furthermore, the transporting device 100 is illustrated in FIG. 1Q, FIG. 1R, FIG. 1S, FIG. 1T and FIG. 1U, in each case in a perspective view of a detail, according to various embodiments. For example, the transporting bars 107 may have been mounted in the respective guiding rail 108 by rollers 117, so that no torque is transferred to the transporting bars 107 during the movement of the transporting bars 107 in the guiding rails 108.

As illustrated in detail for example in FIG. 1Q, each of the transporting bars 107 may have in each case at its opposite end portions an axle 117*a* or a pin 117*a* (for example a fixed axle, cf. FIG. 2C) and a roller 117 rotatably mounted on the axle 117*a* or on the pin 117*a*. The roller 117 may for example have been mounted by a high-temperature-resistant bearing (for example by a high-temperature-resistant deep-groove ball bearing). The bearing may for example be a graphite bearing, for example a dry bearing with a graphite cage for lubrication.

According to various embodiments, the axle 117*a* or the pin 117*a* may include a material with a low thermal conductivity, so that for example as little heat as possible is transferred from the transporting bars 107 into the bearings or onto the guiding rails.

Figure 2A:
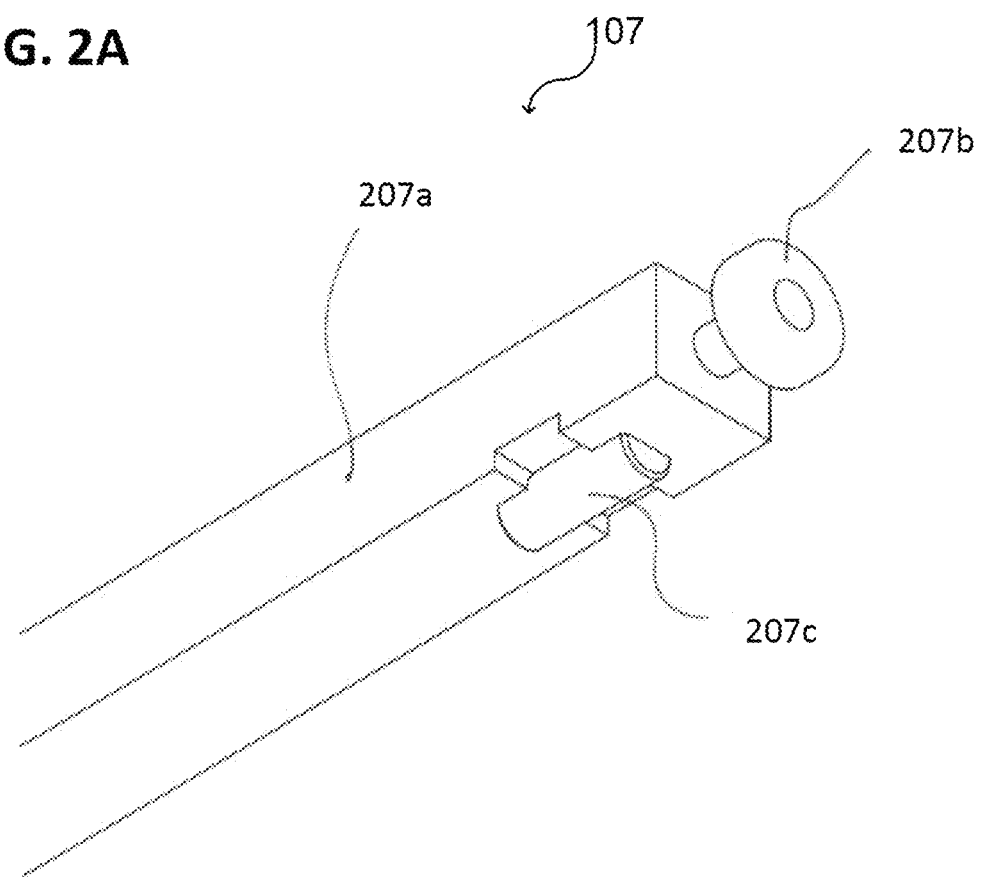
FIGS. 2A to 2C show in each case a bar or transporting bar of a transporting device in various schematic views, according to various embodiments.
Figure 2B:
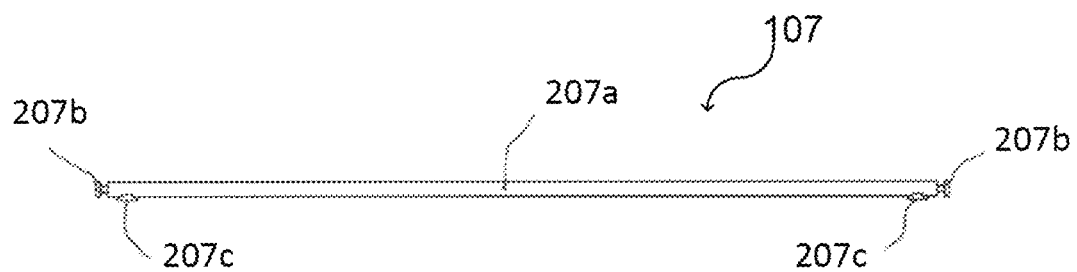
Figure 2C:
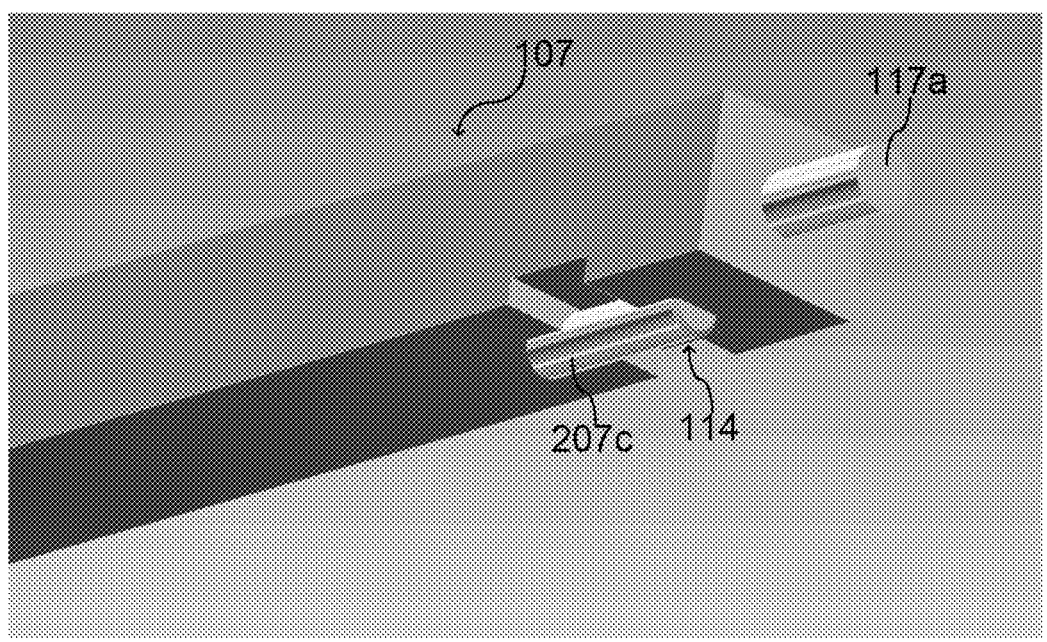

In FIGS. 2A to 2C, a transporting bar 107 of the transporting device 100 is illustrated in each case, according to various embodiments.

FIG. 2A and FIG. 2B in each case show a transporting bar 107 in detail. The transporting bar 107 may for example have a substantially cuboidal carrier element 207*a* (for example produced by water-jet cutting from a CFC sheet). The carrier element 207*a* receives the further add-on parts, such as for example the roller 207*b* and the pin 207*c*, symmetrically on each side. In this case, the pin 207*c* may have been screwed or be screwed into the carrier element 207*a*. Furthermore, the pin 207*c* may have a rotatably mounted casing, or a sleeve may have been fitted or be fitted loosely onto the pin 207*c*, so that for example no torque is transferred from the chain wheel, which can act on the pin 207*c*, to the pin 207*c*, and consequently also to the bar 107.

All of the transporting bars 107 may have been mounted or be mounted in the guiding rails 108 arranged on both sides of the transporting bars 107 by high-temperature ball bearings. The guiding rails 108 may be set up in a continuously circulating manner, as described above. According to various embodiments, the guiding rails 108 may have a mounting opening (not shown), which makes possible and/or facilitates the mounting or removal of individual transporting bars 107 or all of the transporting bars 107.

According to various embodiments, the pin for the roller 207*b* may at the same time also be the pin 207*c*, i.e. in other words a one-piece pin 207*b*, 207*c* may have been provided or be provided (not shown).

As shown in FIG. 2C, the transporting bar 107 (or the bar-shaped carrier element 207*a*) may have a clearance 114 and a pin 207*c* in such a way that the chain wheel 104, 106 can correspondingly act on the transporting bar 107 and can push the transporting bar 107 further along the path of movement. The axle 117*a*, on which the roller 117 may have been fastened or may be fastened by a rotational bearing, may have been fixed or may be fixed to the carrier element 207*a*, for example have been screwed or be screwed into the carrier element 207*a*.

It goes without saying that the transporting device 100 described herein may have been adapted or may be adapted structurally in a way corresponding to various operating situations. For example, the guiding rail arrangement may have been adapted or may be adapted to the overall space within a process chamber for processing a substrate or carrier. Furthermore, the materials used (for example steel for the guiding rails 108 or CFC for the bar-shaped carrier element 207*a* of the transporting bars 107, etc.) may have been adapted or be adapted to the operating situation (for example in the case of a coating process) or to the operating temperature. Furthermore, the transporting bars 107 may for example also be driven and/or braked, or set in motion by another drive, in a number of regions.

In FIGS. 3A to 3C and FIGS. 4A to 4F, a further transporting device 300 (a slat conveyor 300 for transporting substrates) is in each case illustrated in various perspective views and also side views and cross-sectional views and representations of details, according to various embodiments.

Figure 3A:
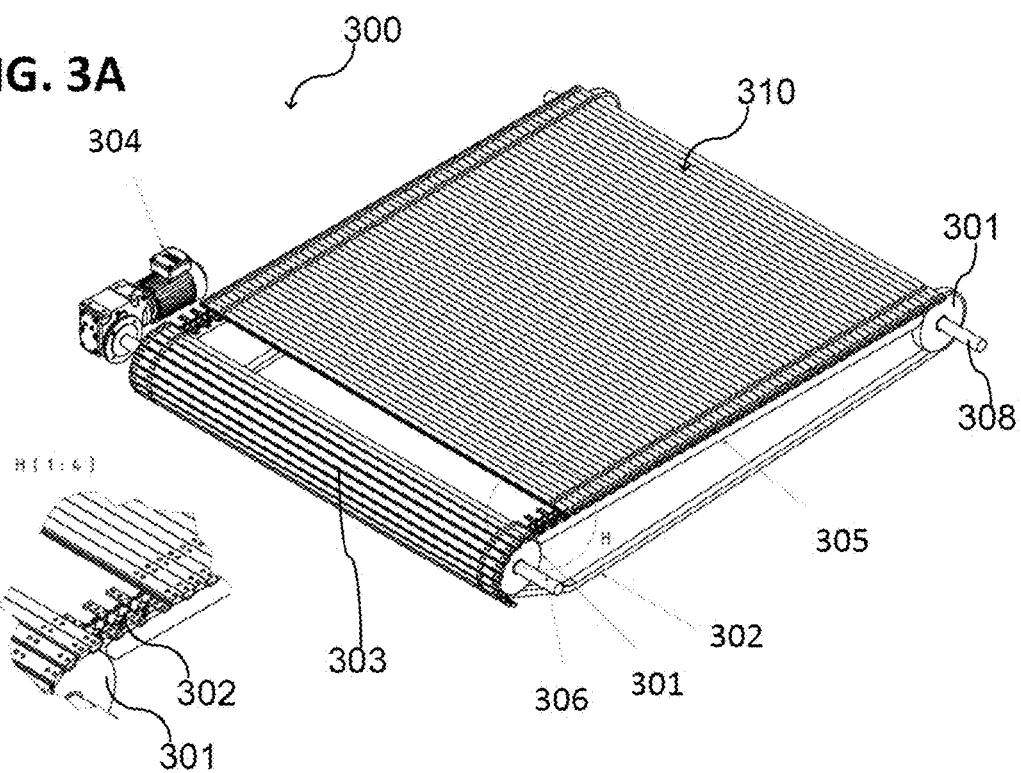
FIGS. 3A to 3C show in each case a transporting device in various schematic views, according to various embodiments.

As shown in FIG. 3A, the moving of a multiplicity of slats 303 can take place for example by a chain drive. In this case, the multiplicity of slats may for example be moved along a closed path of movement.

According to various embodiments, in each case two (continuously circulating) chains 302 may be mounted and driven by at least two shafts 306, 308 with in each case two chain wheels 301 (toothed chain wheels). In this case, the chains 302 may additionally have been guided or be guided by a sliding rail 305 or by multiple sliding rails 305. Furthermore, the chains may in each case have holders (for example lugs or clips) for holding or receiving the slats 303, to which the multiplicity of slats 303 may have been fastened or may be fastened.

The slats 303 may for example form a closed transporting area 310, on which a substrate or a carrier can be transported. According to various embodiments, the slats 303 may include or essentially consist of carbon-fiber-reinforced carbon and/or a ceramic. The drive of the slats 303 may take place by the chains 302, wherein the chains 302 may be moved by a motor (drive) 304 and the drive shaft 306 with two chain wheels 301.

According to various embodiments, the chains 302 may have been thermally insulated from the slats 303 as effectively as possible, so that for example the slats 303 can be exposed to a greater thermal loading than the chains 302 could withstand. For example, the slats 303 may be heated up to a temperature of over 1000° C., while the chains 302 may have a maximum operating temperature of approximately 200° C.

Figure 3B:
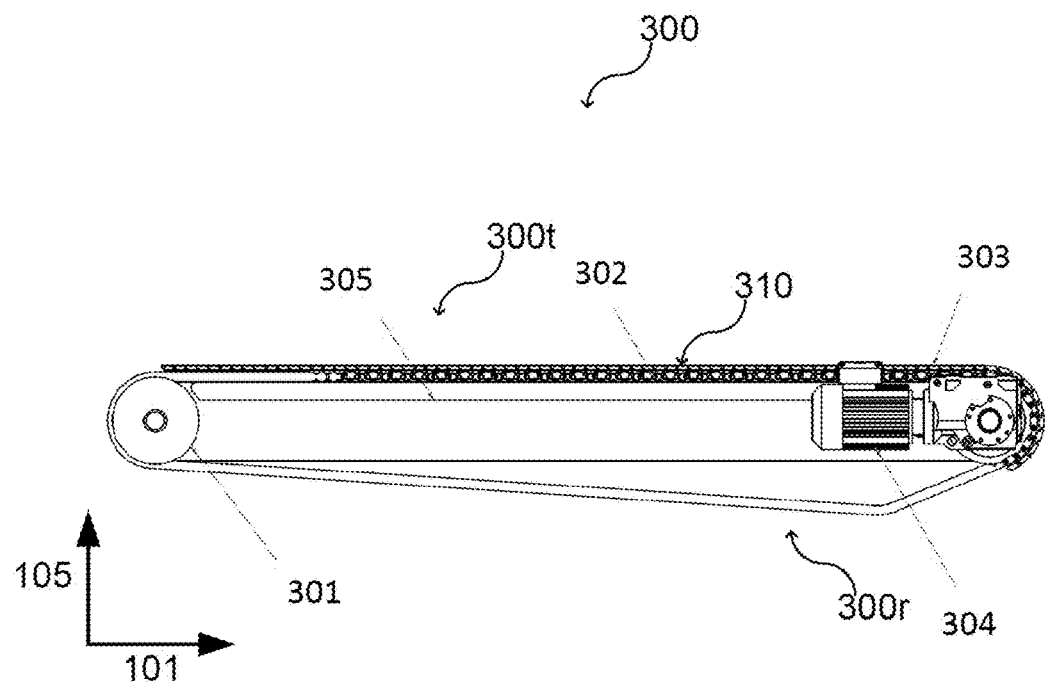

In FIG. 3B, a schematic side view of the transporting device 300 shown in FIG. 3A is illustrated, according to various embodiments.

According to various embodiments, the slats 303 may form in a transporting region 300t of the transporting device 300 a planar supporting area 310 (a planar substrate support), which may be substantially gastight in the vertical direction 105. By the supporting area 310 of the transporting device 300 formed by the slats 303, it is possible for example for a substrate to be transported along the transporting direction 101 through a process chamber, wherein the slats 303 can be cleaned in a cleaning region 300r. For example, the slats 303 may be cleaned thermally (by re-evaporation of the coating material deposited on the slats 303) or mechanically. According to various embodiments, the transporting device 300 may be set up or the chain guidance may take place in such a way that the slats 303 in the cleaning region 300r are moved on a curved path of movement, so that for example gaps open up between the individual neighboring slats, and consequently a greater area of attack is provided for the cleaning of the slats 303.

Figure 3C:
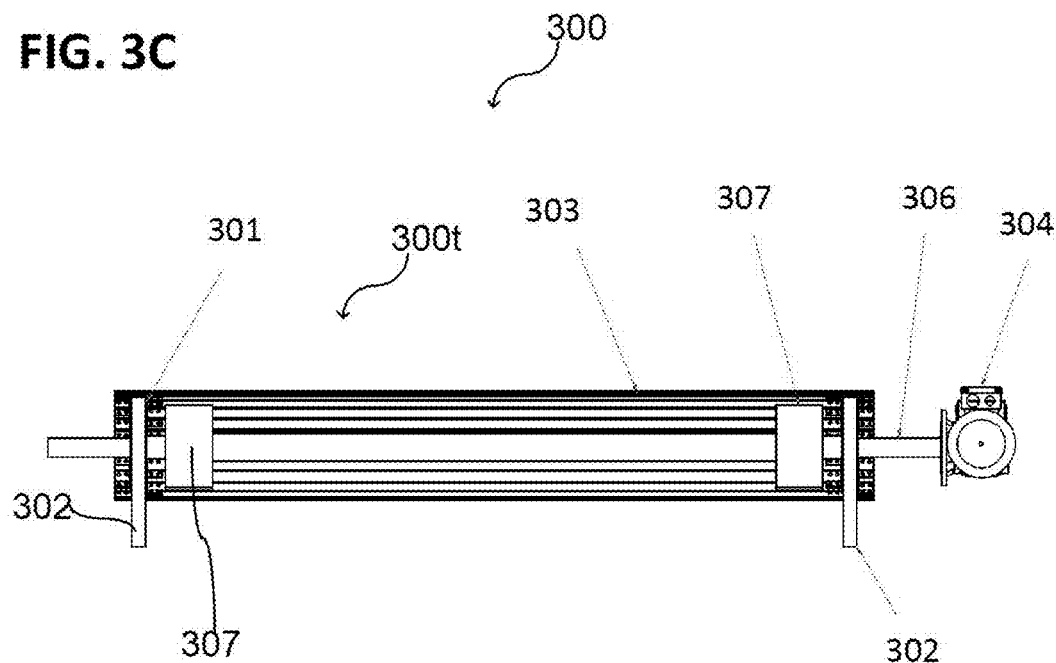
Figure 3D:
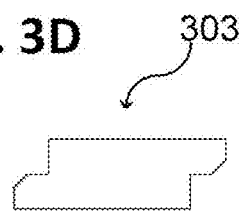
FIGS. 3D to 3G show in each case a slat or transporting slat of a transporting device in a cross-sectional view, according to various embodiments.
Figure 3E:
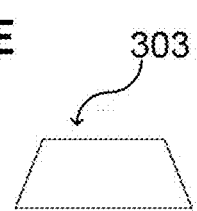
Figure 3F:
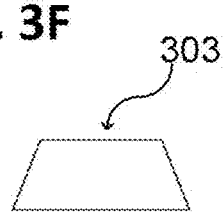
Figure 3G:
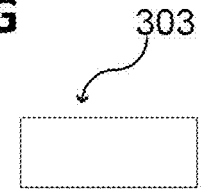
Figure 4A:
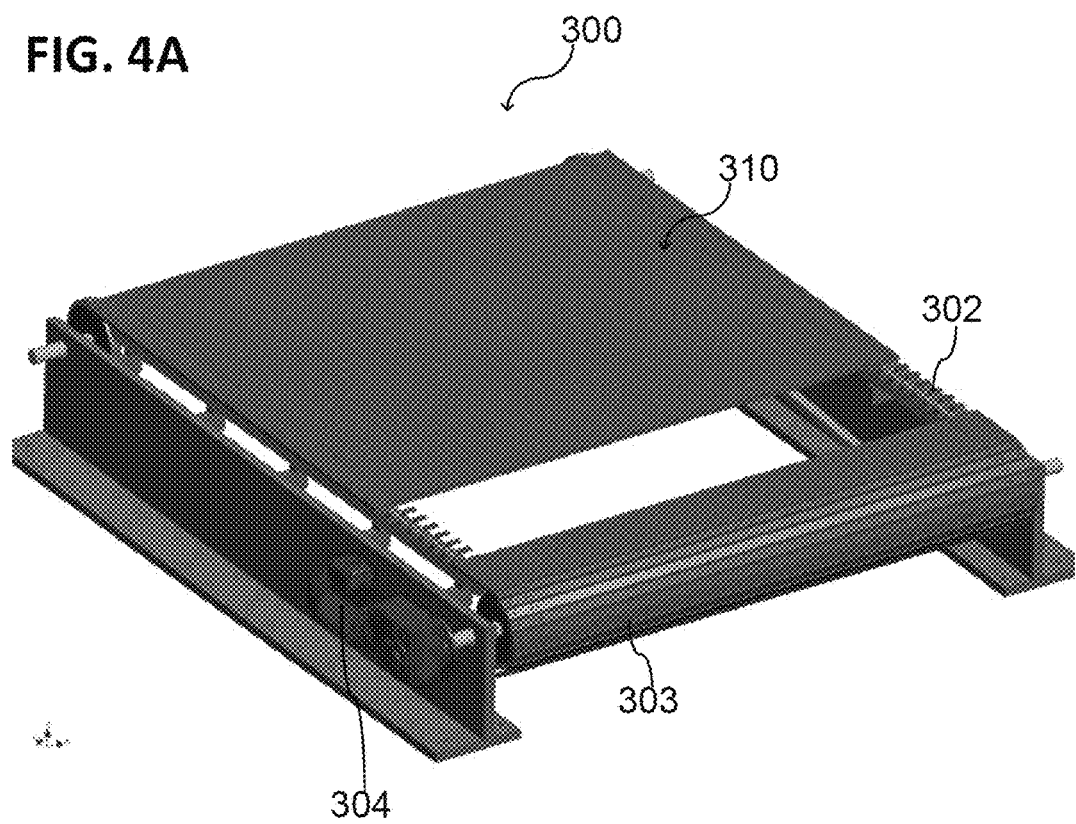
FIGS. 4A to 4F show in each case a transporting device in various schematic views, according to various embodiments.
Figure 4B:
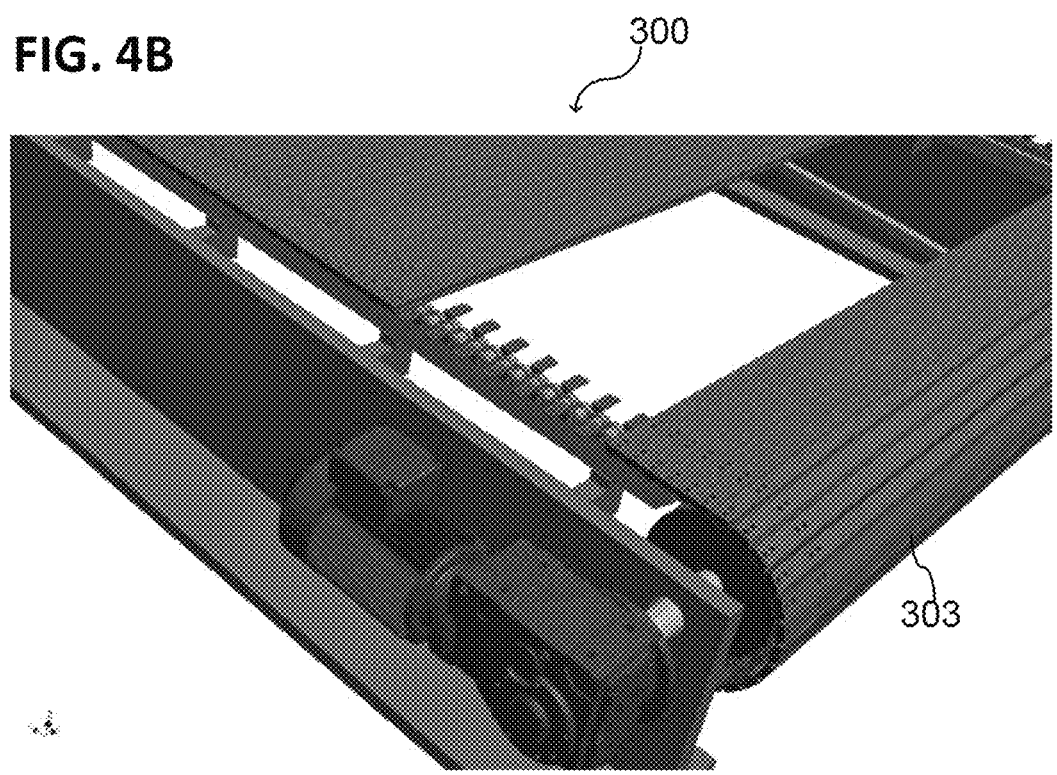
Figure 4C:
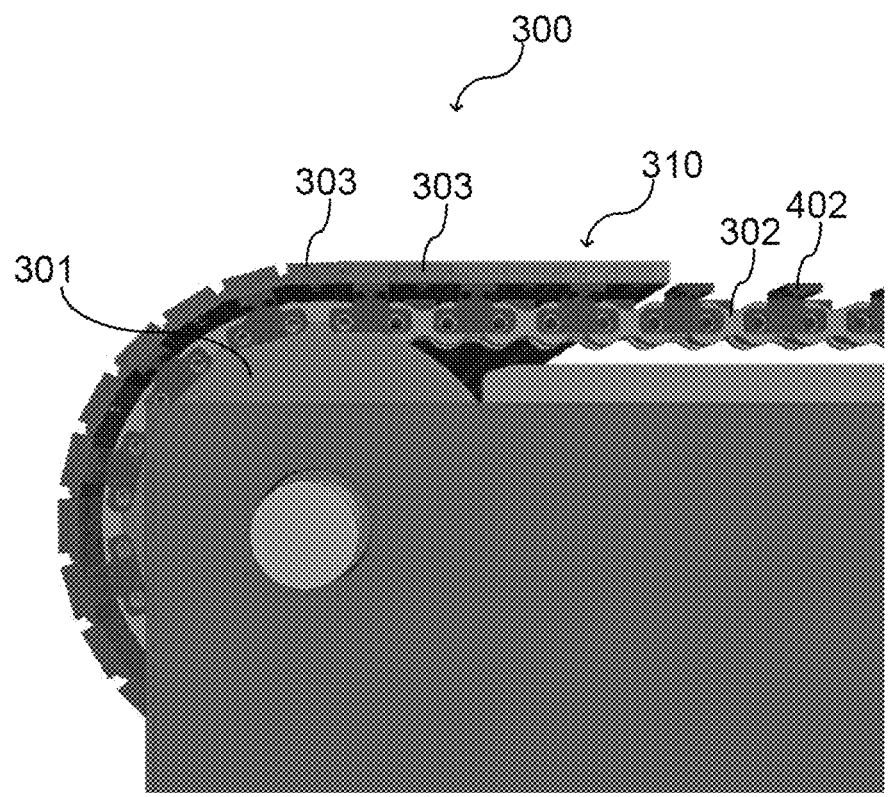
Figure 4D:
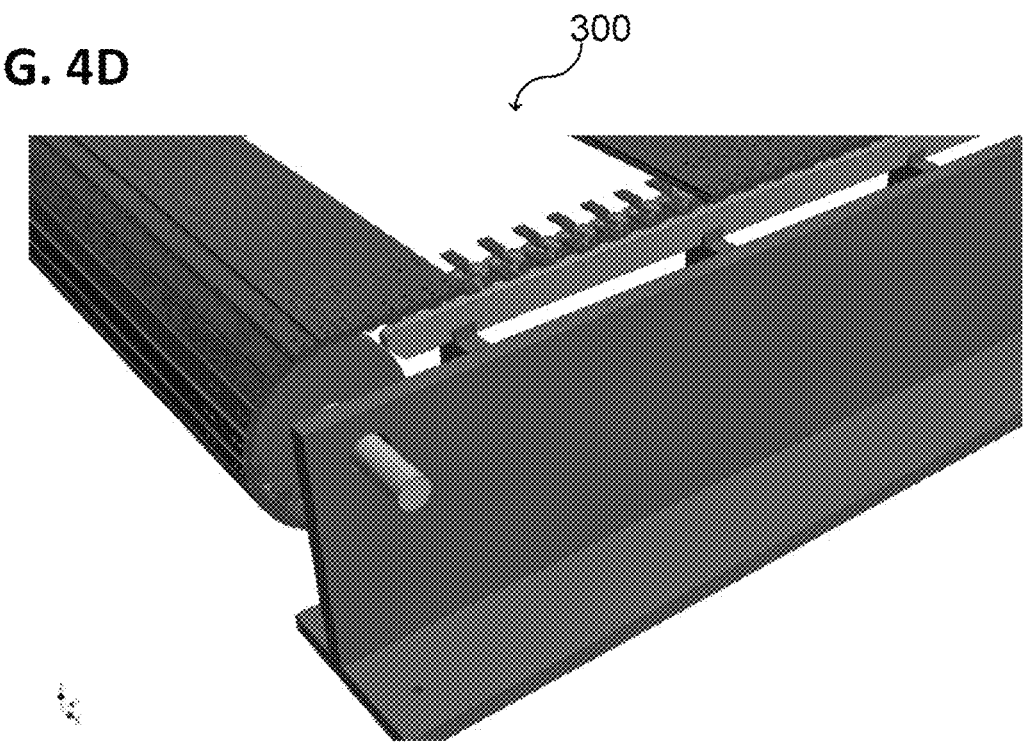
Figure 4E:
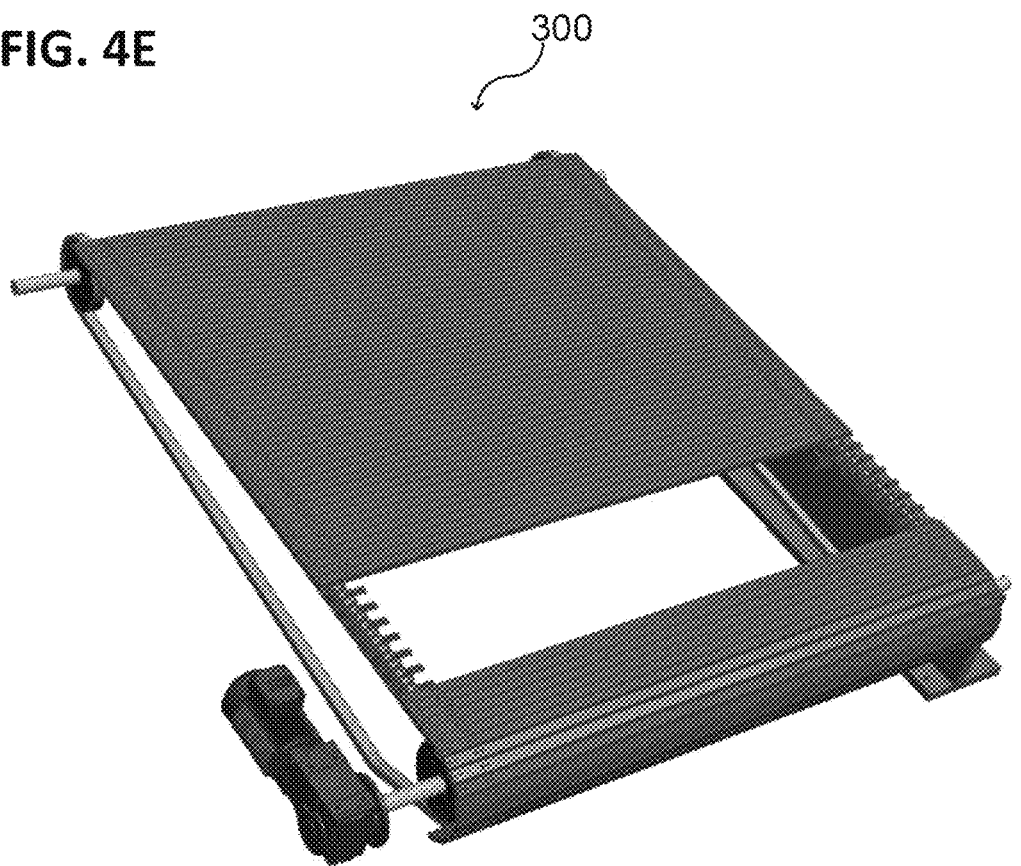
Figure 4F:
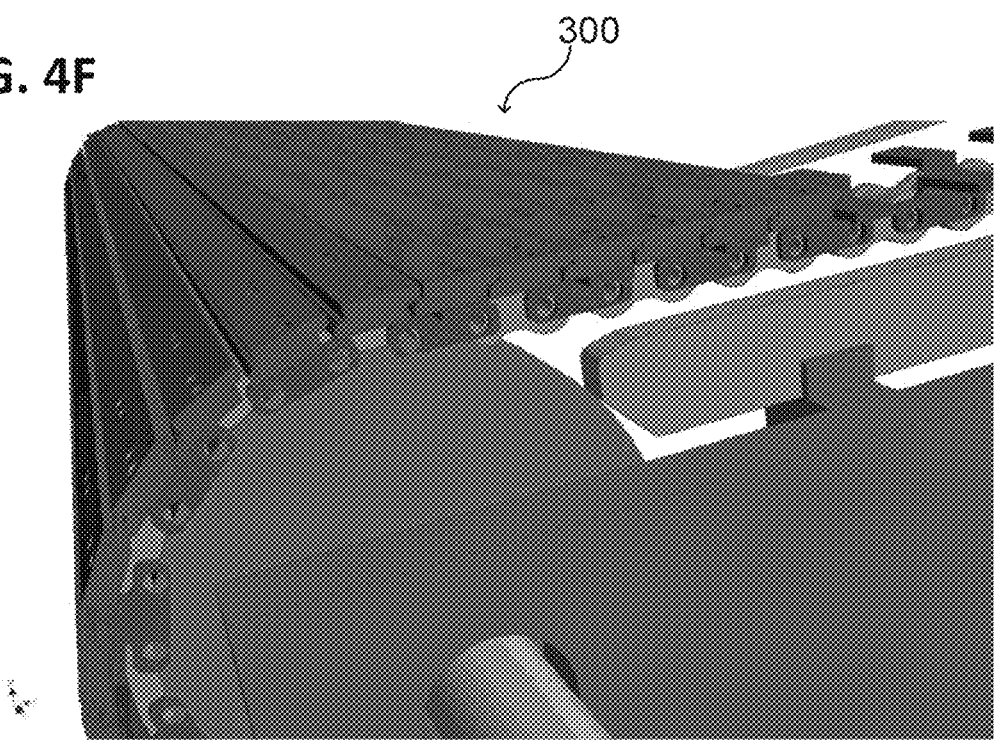

As illustrated in FIG. 3C in a schematic cross-sectional view of the transporting device 300, a thermal shielding structure 307 (a thermal insulation) may have been provided or be provided between the two chains 302, so that for example the chains 302 may be protected from thermal radiation or heat input.

In FIG. 3D, FIG. 3E, FIG. 3F and FIG. 3G, in each case various possible cross-sectional shapes for the slats 303 of the transporting device 300 are illustrated. The slats 303 may for example be set up in such a way that they do not protrude beyond the transporting level during the deflection of the slats before and after the transporting section in the transporting region 300t, and consequently do not tip the transported substrates off.

Furthermore, FIG. 4A, FIG. 4B, FIG. 4C, FIG. 4D, FIG. 4E and FIG. 4F illustrate the transporting device 300 with the chain-driven slats 303 in each case in various perspective views, according to various embodiments. As illustrated for example in FIG. 4A and FIG. 4C, the slats 303 form a closed transporting area 310 on the upper side of the transporting device 300. For example, respectively neighboring slats 303 may engage in one another or partially overlap one another. In this way it is possible for example for the region underneath the transporting area 310 to be protected from material vapor being deposited in the region underneath the transporting area 310 when a coating process is carried out above the transporting area 310. Illustratively, it is possible for example to prevent the transporting device 300 and/or other internal components from being excessively coated when for example a high-rate coating process is carried out above the transporting area 310.

According to various embodiments, the chain guidance of the chains 302 of the transporting device 300 may take place by correspondingly set-up shafts and chain wheels.

For example, the chain guidance may take place in a straight line in the transporting region 300t of the transporting device 300.

Furthermore, the transporting device 300 may have a returning region 300r (for example set up as cleaning region 300r for cleaning the slats 303), in which the slats 303 in each case move counter to the transporting direction 101 of a substrate in the transporting region 300t of the transporting device (cf. for example FIG. 3B).

According to various embodiments, the chain guidance may be curved in the returning region. In this way the slats 303 of the transporting device can for example be cleaned better, since a gap can open up between the slats 303 during transport along a curvature.

It goes without saying that the further transporting device 300 described herein may have been adapted or be adapted structurally in a way corresponding to various operating situations. For example, the chain guidance may have been adapted or be adapted to the overall space within a process chamber for the processing of a substrate or carrier. Furthermore, the materials used (for example steel for the chains 302 or CFC for the slats 303, etc.) may have been adapted or be adapted to the operating situation (for example in the case of a coating process) or to the operating temperature. Furthermore, the slats 303 may for example also be driven or braked, or set in motion by another drive, in a number of regions.

Figure 5A:
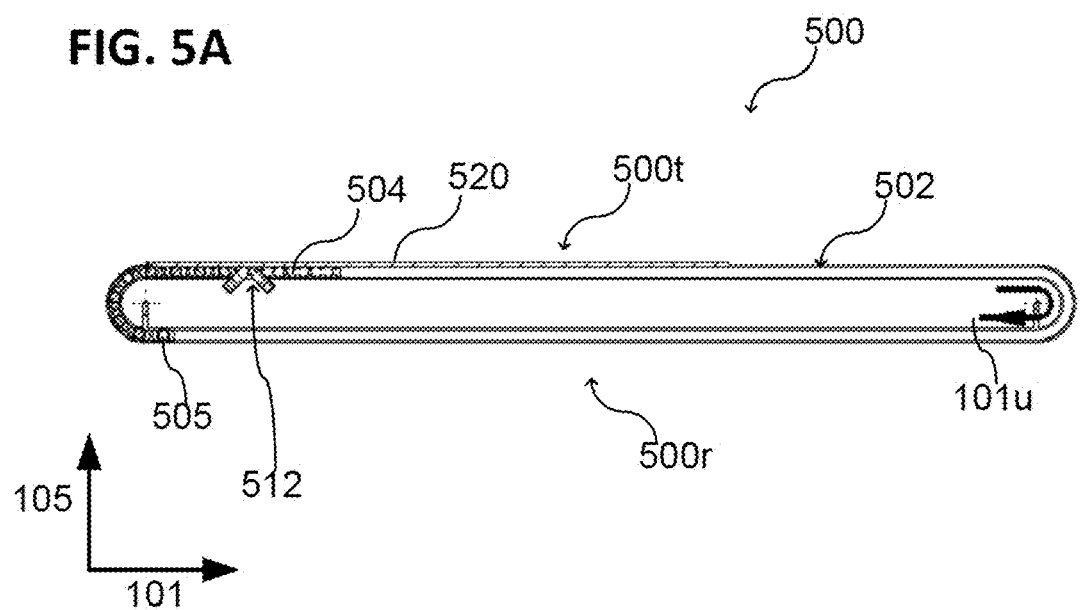
FIGS. 5A and 5B show in each case a transporting device in various schematic views, according to various embodiments.
Figure 5B:
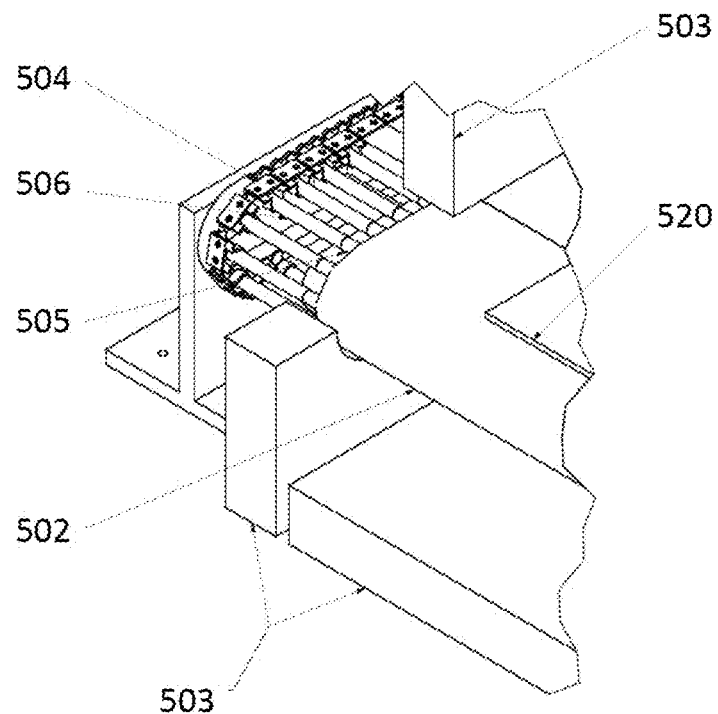

In FIG. 5A and FIG. 5B, a further transporting device 500 (a belt conveyor for transporting substrates) is in each case illustrated in a cross-sectional view and in a perspective view, according to various embodiments. In this case, a transporting belt 502 for example may be moved by rods 505 (carrying rods). The rods 505 may be mounted and driven by a chain drive 504 (by two continuously circulating chains 504).

According to various embodiments, the transporting belt 502 may be set up in a continuously circulating manner, as illustrated for example in FIG. 5A. In this case, the transporting belt 502 may have been tensioned or be tensioned by a tensioning device 512. By the tensioning device 512, for example, both ends of the transporting belt 502 can be clamped in or clamped fast.

According to various embodiments, the transporting device 500 may have two continuously circulating chains 504 (drive chains) (wherein the two continuously circulating chains have for example in each case been tensioned between at least two chain wheels). A multiplicity of carrier rods 505 be set up between the two continuously circulating chains 504 in such a way that the carrier rods 505 move along a closed path of movement (driven by the chain drive). The carrier rods 505 may for example have been fastened or be fastened with their opposite end portions in each case to the continuously circulating chains 504, for example by clips. The transporting belt 502 may be set up as a carrier structure for carrying and transporting a substrate 520 in a process region of a process chamber. Furthermore, the transporting belt 502 may have been tensioned or be tensioned between the multiplicity of carrier rods 505 by a tensioning device 512. By moving the transporting belt 502 in the circulating direction 101*u*, the substrate can be transported along the transporting direction.

Illustratively, the substrate 520 can lie on the closed transporting belt 502 and be transported through a process region 500*t* (coating region) of a process chamber. In this case, the transporting belt 502 may have a predefined operating temperature, wherein furthermore the substrate 520 and the transporting belt 502 may be coated in the transporting region 500*t* (process region).

According to various embodiments, the chain drive and the chain guidance of the respective chains 504 of the transporting device 500 may take place by correspondingly set-up shafts and chain wheels. For example, the chain guidance may take place in a straight line in the transporting region 500*t* of the transporting device 500. In this way the transporting belt 502 also forms a planar supporting area for a substrate 520 in the transporting region 500*t*.

Furthermore, the transporting device 500 may have a returning region 500*r* (for example set up as cleaning region 500*r* for cleaning the transporting belt 502), in which the transporting belt 502 moves counter to the transporting direction 101 of a substrate in the transporting region 500*t* (cf. for example FIG. 5A).

According to various embodiments, the chain guidance, and consequently the belt guidance, may be set up as curved in the returning region 500*r*. Furthermore, the chain guidance, and consequently the belt guidance, may run straight in the entire returning region 500*r*.

According to various embodiments, an undesired coating of the transporting belt 502 can be eliminated by re-evaporation of the coating material in the returning region 500*r* (heating region 500*r*). Furthermore, the transporting device 500 may be set up in such a way that the transporting belt 502 (or a portion of the transporting belt 502) is at operating temperature again when the transporting belt 502 (the portion of the transporting belt 502) takes up a new substrate 520 again in the transporting region 500*t*.

As illustrated in FIG. 5B, the transporting belt 502 may run on carrying rods 505, which are thermally insulated laterally, whereby for example the drive chain 504 (or the chain drive 504) may have been protected or be protected from thermal loading. Thermal insulation of the chain drive 504 may take place for example by the carrying rods 505 being fastened to the drive chain 504 in each case by a thermally poorly conducting insulating element 506. The fastening of the carrying rods 505 (carrier rods 505) and the insulating elements 506 (insulating rods 506) to the drive chain 504 may take place for example by a clip or clamp or the like. According to various embodiments, precisely one carrying rod 505 (or precisely one carrier rod 505) may have been fastened or be fastened in each case to each movable chain link of the drive chain 504.

According to various embodiments, a carrier rod 505 (a carrying rod) of the transporting device 500 may essentially consist of a thermally stable material or include a thermally stable material, for example CFC, a ceramic, or steel. Furthermore, a portion 506 of the carrier rod 505 or an insulating element 506 may include a thermally insulating material, for example alumina ($Al_2O_3$).

Furthermore, the drive chain 504 may for example have been arranged or be arranged outside a process region and a substrate 520 may be transported by the transporting belt 502 within the process region in a process chamber. In this case, the drive chain 504 may have been thermally insulated or be thermally insulated from the process region by additional insulating elements 503. In other words, the process region may have been thermally shielded (insulated) from the outside by multiple insulating elements 503. For example, a coating process may be carried out at a temperature of over 500° C. in the process region, while the temperature of the drive chains 504 of the transporting device 500 can remain below approximately 200° C. on account of the thermal insulations.

Illustratively, a kind of process tunnel may have been formed or be formed by the insulation 503. The drive elements are arranged outside this process tunnel and as a result are largely protected from contamination and/or thermal loading. According to various embodiments, the transporting device 100 may have been arranged in a vessel in which a coating process can be carried out, for example a high-rate coating process. For example, the coating of a substrate transported by the transporting device 500 may take place by a hot carrier gas, in which the coating material is transported in the gas phase. For example, the coating may take place at a process pressure in the transporting region 500*t* (or in the process space within the vessel) in a range from approximately 1 mbar to approximately 900 mbar.

In FIGS. 6A to 6D, a processing arrangement 1000 is in each case illustrated in various cross-sectional views, according to various embodiments. In this case, the processing arrangement 1000 may have at least one transporting device 100, 300, 500, as described above. For example, the processing arrangement 1000 may have a bar conveyor 100, a slat conveyor 300 or a belt conveyor 500 for transporting substrates in a process chamber 1002 of the processing arrangement 1000.

According to various embodiments, the processing arrangement 1000 may have the following: a process chamber 1002 (a chamber housing 1002) for processing (for example coating) a substrate 1012 within a processing region 1011 of the process chamber 1002. The process chamber 1002 further has a cleaning region 1013 for cleaning at least a part or a portion of a transporting device 1014; a transporting device 1014 arranged between the coating region 1011 and the cleaning region 1013. The transporting device 1014 has a carrier structure 1014*a* for carrying and transporting a substrate 1012 in the processing region 1011. The transporting device 1014 has also been set up in such a way that the carrier structure 1014*a* of the transporting device 1014 can be moved through the cleaning region 1013

(or can be moved in the cleaning region 1013); and a cleaning device 1004 for cleaning the carrier structure 1014*a* (or a part or a portion of the transporting device 1014) in the cleaning region 1013.

According to various embodiments, the processing arrangement 1000 (coating arrangement 1000) may have the following: a process chamber 1002 for coating a substrate 1012 within a coating region 1011 of the process chamber 1002. The process chamber 1002 further has a cleaning region 1013 for cleaning at least a carrier structure 1014*a* of a transporting device 1014 for carrying and transporting a substrate 1012; a transporting device 1014 arranged between the coating region 1011 and the cleaning region 1013. The transporting device 1014 has a carrier structure 1014*a* for carrying and transporting a substrate 1012 in the coating region 1011. The transporting device 1014 has also been set up in such a way that at least the carrier structure 1014*a* of the transporting device 1014 can be moved through the cleaning region 1013 (or can be moved in the cleaning region 1013); and a cleaning device 1004 for cleaning at least the carrier structure 1014*a* of the transporting device 1014 in the cleaning region 1013.

Figure 6A:
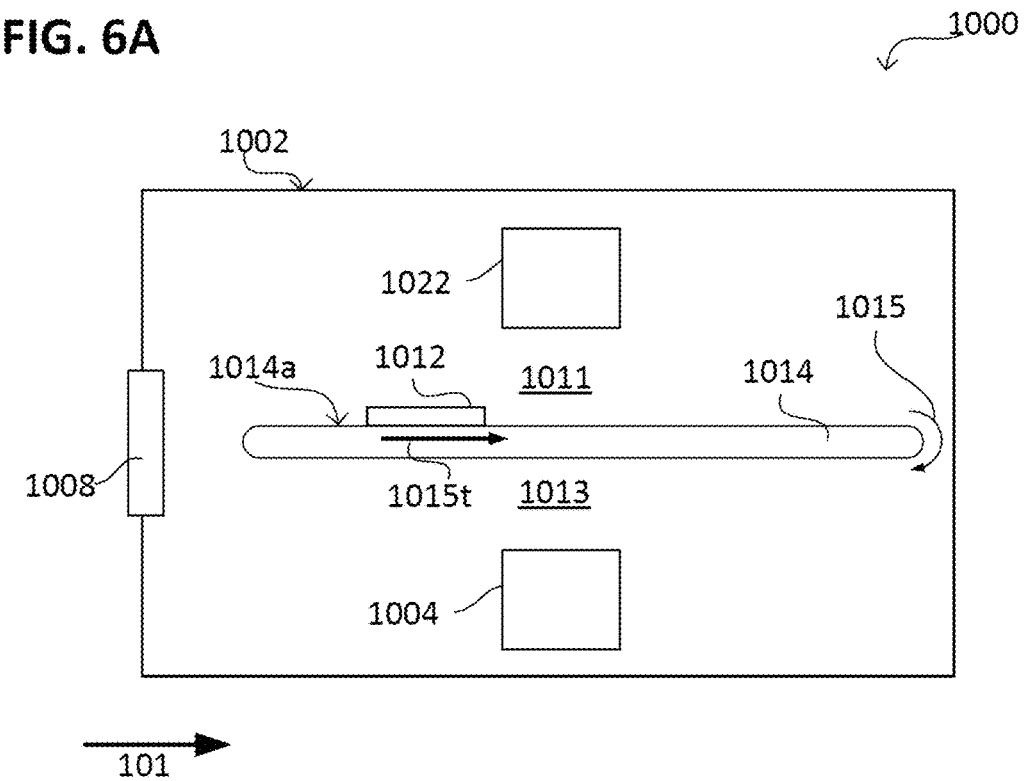
FIGS. 6A to 6D show in each case a processing arrangement in various schematic views, according to various embodiments.

FIG. 6A illustrates a processing arrangement 1000 in a schematic cross-sectional view, according to various embodiments.

The processing arrangement 1000 may have a process chamber 1002 for processing a substrate 1012 within the process chamber 1002. For processing the substrate 1012 within the process chamber 1002, the latter may be set up in such a way that the ambient conditions (in other words process conditions such as for example a pressure, a temperature and/or a gas composition within the process chamber) can be set and/or controlled during the processing of the substrate 1012. For this purpose, the process chamber 1002 of the processing arrangement 1000 may for example be set up or be set up as air-tight, dust-tight and/or vacuum-tight.

According to various embodiments, the process chamber 1002 may be set up as an atmospheric pressure process chamber 1002, for providing a process gas environment under atmospheric pressure within the process chamber 1002. Within the process chamber 1002, for example a gas and/or a gas mixture with a pressure in a range from approximately 900 mbar to approximately 1100 mbar may have been provided or be provided.

According to various embodiments, the process chamber 1002 may be set up as a vacuum process chamber 1002, for providing a vacuum or at least a negative pressure within the process chamber 1002. In other words, the process chamber 1002 may illustratively be set up in a stable enough manner that the process chamber 1002 can be evacuated (pumped out), so that, when the process chamber 1002 has been evacuated, a pressure (for example the prevailing air pressure) can act against the process chamber 1002 from the outside without the process chamber 1002 being irreversibly deformed and/or damaged.

For the pumping out of the process chamber 1002, the process chamber 1002 may for example have been coupled to a pump system, so that a negative pressure may have been provided or may be provided within the process chamber 1002. The pump system may for example be set up as a vacuum pump system and/or high-vacuum pump system, so that a vacuum and/or a high vacuum may have been provided or may be provided within the process chamber 1002.

Furthermore, a process chamber 1002 may form part of a processing installation (for example a vacuum processing installation, a negative pressure processing installation or an atmospheric pressure processing installation). Such a processing installation may for example be set up as an installation known as an in-line processing installation, by which substrates can be continuously processed, or as an installation known as a batch processing installation, by which substrates can be processed in batches.

Furthermore, the process chamber 1002 may have been connected to a gas feed, so that the process chamber 1002 can be fed a process gas or a gas mixture (for example of a process gas and a reactive gas) by the gas feed.

Furthermore, within the process chamber a substrate (or multiple substrates) may also be coated by a material vapor. The material vapor can be introduced into the process chamber from outside by a carrier gas. Furthermore, within the process chamber, a substrate (or multiple substrates) may also be coated by a gas stream, the gas stream including the material to be coated as material vapor. In this case, a process pressure in a range from approximately 1 mbar to approximately 1000 mbar may have been provided or be provided in the process chamber.

For charging and/or discharging a substrate 1012 into the process chamber 1002 or out of the process chamber 1002, the process chamber 1002 may have at least one opening 1008 (access opening). To be able to provide a vacuum and/or a negative pressure in the process chamber 1002, the opening 1008 may be set up in such a way that it can be sealed off, for example by a valve, for example by a flap valve or a gap seal.

Furthermore, the process chamber 1002 may have a processing region 1011, in which a substrate 1012 can be processed. The processing of a substrate may for example include working, coating, heating, etching and/or structurally modifying a substrate 1012.

For processing the substrate 1012, the processing arrangement 1000 may for example have a processing source 1022, by which a substrate 1012 can be processed. The processing source 1022 may for example have a heat source 1022 (for example a heat radiation source, such as a radiant heater), an ion source 1022 (for example an ion beam source), a plasma source 1022, an etching gas source 1022, a light source 1022 (for example a flashlight or a laser), an electron source 1022 (for example an electron beam source) and/or a material vapor source 1022 (for example a magnetron 1022 or an electron beam evaporator 1022).

Cathode sputtering (known as sputtering or sputter deposition) may be used for example for coating the substrate 1012. According to various embodiments, the sputtering may take place by a magnetron 1022 (for example a tube magnetron 1022 and/or a planar magnetron 1022). For this purpose, a material to be deposited (target material) may be atomized by the magnetron 1022. The atomized target material can spread into the processing region 1011. When a substrate 1012 has been arranged in the processing region 1011, the atomized target material that has spread into the processing region 1011 can be deposited on the substrate 1012 and form a layer. In other words, target material atomized during the sputtering can spread away from a magnetron 1022 into the processing region 1011, so that the substrate 1012 can be coated with the atomized target material in the processing region 1011.

By analogy, a target material may be made to evaporate by an electron beam evaporator 1022 and a substrate 1012 can be coated with the evaporated target material in the processing region 1011.

For etching a substrate 1012 in the processing region 1011, the processing arrangement 1000 may have a plasma source 1022. The plasma source 1022 may illustratively be set up in such a way that a plasma that can act on a substrate 1012 arranged in the processing region 1011 is generated by the plasma source 1022. In this case it is possible for example for material to be removed from the substrate 1012 by the plasma (in other words etched away). The removed material may spread into the processing region 1011. In this way it can be achieved for example that a substrate (for example a surface of the substrate) can be cleaned.

For example, a reactive plasma process can be carried out by the processing source 1022 in the processing region of the process chamber 1002, for example for etching or coating the substrate 1012.

For heating up the substrate 1012 in the processing region 1011, the processing arrangement 1000 may have a heat source 1022, for example a radiation source 1022, for example a heat radiation source, for example a radiant heater). In this case, as a result of the irradiation of the substrate, deposited coating material can evaporate away again (re-evaporate) from the heated-up substrate. In this way it can be achieved for example that the substrate (for example a surface of the substrate) can be cleaned.

By analogy, the substrate 1012 can be etched by an etching gas source 1022. A reactive gas may be provided by the etching gas source 1022, allowing the reactive gas to react with the substrate (or a material on the substrate), allowing the reaction product to evaporate away from the substrate.

By analogy, a substrate 1012 may be worked, for example heated up and/or etched, by an ion beam source 1022. The ion beam source 1022 can provide ions that can be emitted in the direction of the substrate. The ions provided by the ion beam source 1022 may for example atomize material from the substrate or react with the substrate (or a material on the substrate), allowing the reaction product to evaporate away from the substrate.

By analogy, the substrate 1012 may be worked, for example heated up and/or structurally modified, by a light source 1022. The light source 1022 can emit light (for example ultraviolet light, visible light and/or infrared light) in the direction of the substrate 1012 (in the direction of the processing region 1011). The light source 1022 may be set up in such a way that the light emitted by the light source 1022 has a sufficient light intensity to allow the substrate and/or its surface to be heated up for example to a predefined temperature.

For transporting a substrate 1012, the processing arrangement 1000 may have a transporting device 1014. The transporting device 1014 may be set up in the way described above (compare for example the transporting device 100, 300, 500 in FIG. 1A to FIG. 1U, FIG. 3A to FIG. 3C, FIG. 4A to FIG. 4F and/or FIG. 5A and FIG. 5B). The transporting device 1014 may be set up in such a way that a substrate 1012 can be transported into the processing region 1011, out of the processing region 1011, and/or within the processing region 1011 by the transporting device 1014.

For carrying a substrate 1012 to be transported, the transporting device 1014 may have a carrier structure 1014a, on which the substrate to be transported by the transporting device 1014 can lie. The carrier structure 1014a of the transporting device 1014 may have been mounted or be mounted in such a way that it can be moved along a direction 1015. The carrier structure 1014a of the transporting device 1014 may for example be set up in a continuously circulating manner. Furthermore, the transporting device 1014 may have a drive 1024 for driving the carrier structure 1014a. The drive 1024 may be part of a drive device. For example, the drive 1024 may transfer a force to the carrier structure 1014a, so that the latter can be moved in the direction 1015.

Illustratively, the carrier structure 1014a may provide a substrate support that is movable (for example along the circulating direction 1015).

The carrier structure 1014a may for example be set up as a transporting belt 1014a that has been tensioned between at least two deflecting rollers. In other words, the carrier structure 1014a may be set up as a continuous transporting belt 1014a that runs around two defecting rollers or sliding rollers and may serve at the same time as a carrying and drawing means.

As described above, the transporting device 1014 may have a chain drive with two continuously circulating chains. A multiplicity of carrier rods may be set up between the two continuously circulating chains in such a way that the carrier rods move along a closed path of movement while being driven by the chain drive. The carrier structure 1014a has been set up as a transporting belt that has been tensioned over the multiplicity of carrier rods.

The transporting belt 1014a may include a woven fabric, which may have fabric fibers of at least one material from the following group of materials: carbon, graphite, glass, quartz glass, polyamide and/or aramid. Illustratively, the transporting belt 1014 (and also for example the carrier rods) may be set up in a heat-resistant manner, for example set up to be stable up to approximately 1500° C., for example up to approximately 1000° C., for example up to approximately 800° C., for example up to approximately 600° C. Furthermore, the transporting belt 1014a may be set up in such a way that a material lying against the transporting belt 1014a can be detached again from the transporting belt 1014a.

As described above, the transporting device 1014 may have multiple carrier elements 1014a (slats 303) coupled to a chain drive 1024. The carrier elements may for example be connected to chain links of the chain drive 1024 and set up in such a way that the carrier elements are moved in the circulating direction 1015 by the chain drive 1024. The carrier elements may for example be connected and/or coupled on both sides to the chain links of the drive chains set up in a continuously circulating manner or some other series arrangement of movable elements that are inserted in one another or connected by articulated joints.

According to various embodiments, the chain drive 1024 may have been arranged outside the processing region 1011 and substrates 1012 may be carried and moved within the processing region 1011 by the slats 1014a.

As described above, the transporting device 1014 may have two guiding rails. The carrier structure 1014a may have multiple bars 107 (cf. FIG. 2A to FIG. 2C). The two guiding rails may be set up in such a way that the multiple bars are mounted between the two guiding rails and guided along a closed path of movement.

Generally, the material that is made to evaporate and/or atomized during the processing of a substrate 1012 in the processing region 1011 can be deposited on the transporting device 1014, for example on the carrier structure 1014a. In other words, the transporting device 1014 (and/or the carrier structure 1014a) may be contaminated during the processing of a substrate 1012 in the processing region 1011.

The contamination of the transporting device 1014 may for example impair the function of the transporting device 1014. For example, a greater force may be necessary for driving the transporting device 1014 if more material has been deposited on the transporting device 1014. Illustratively, a bearing structure of the transporting device 1014 that has been set up for guiding and/or bearing movable components, for example the carrier structure 1014a, may be contaminated, whereby the freedom of movement of the carrier structure 1014a may be restricted.

The depositing of material on the transporting device 1014 may for example cause it to become unable to function, whereby the processing of a substrate (for example a process proceeding in the processing chamber 1022) may be interrupted. In order to be able to continue processing of a substrate, it may then be necessary to change the transporting device 1014. Both an interruption of the processing and a change of the transporting device 1014 may involve additional costs and production downtime.

According to various embodiments, the carrier structure (for example the transporting belt 1014a) may be set up in such a dust-tight and/or gas-tight manner that further components of the transporting device 1014 may have been protected or be protected from contamination by the carrier structure 1014a. According to various embodiments, the carrier structure with its multiplicity of carrier elements (the multiplicity of bars or the multiplicity of slats) may be set up (for example arranged in series with one another and have a corresponding form) in such a way that the multiplicity of carrier elements form a dust-tight and/or gas-tight substrate support, so that further components of the transporting device 1014 may have been protected from contamination by the carrier structure 1014a. For example, the carrier structure 1014a may be set up in such a way that illustratively as little material as possible can penetrate through the carrier structure 1014a, whereby depositing of material on components of the transporting device 1014 that are arranged behind (or underneath) the carrier structure 1014a can be prevented or at least reduced.

Illustratively, the carrier structure 1014a may be contaminated (coated) considerably during the processing of a substrate 1012. Material that has been deposited on the carrier structure 1014a may impair the processing of a substrate 1012. For example, material deposited on the carrier structure 1014a may be transferred to a substrate 1012 that is being transported by the carrier structure 1014a, so that the substrate may be contaminated. It may illustratively be necessary to clean the carrier structure 1014a. The more material is evaporated for processing, the more frequently cleaning may be required. For example, a process may require that the carrier structure 1014a is cleaned periodically, for example once every circulation or each time a predefined number of substrates 1012 has been processed.

According to various embodiments, the processing arrangement 1000 may have a cleaning device 1004 for cleaning the transporting device 1014 and/or the carrier structure 1014a (for example for re-evaporation of coating material deposited on the carrier structure 1014a). The cleaning device 1004 may be set up in such a way that at least the carrier structure 1014a of the transporting device 1014 can be cleaned in a cleaning region 1013 of the process chamber 1002. For this purpose, the transporting device 1014 may be set up in such a way that the carrier structure 1014a can be moved through the cleaning region 1013.

The cleaning device 1004 may be set up in such a way that material deposited on the carrier structure 1014a can be carried away or removed during the cleaning by the cleaning device 1004.

According to various embodiments, the carrier structure 1014a may be heated up for the cleaning. For this purpose, the cleaning device 1004 may for example have a heat source 1004 (for example an induction heater), a radiation source 1004 (for example a heat radiation source, in other words a radiant heater), a light source 1004 (for example a flashlight or a laser) and/or an electron source 1004 (for example an electron beam source).

Depending on the process pressure, the heating up of the carrier structure 1014a may take place by thermal radiation, thermal conduction and/or convection. In other words, any desired suitable heat source may be used.

The cleaning device 1004 may for example be set up in such a way that the carrier structure 1014a can be heated up in the cleaning region 1013 to a temperature greater than a predefined evaporating temperature, for example to a temperature of over 600° C. or over 800° C., for example to a temperature of over 1000° C., for example to a temperature of over 1200° C., for example to a temperature of over 1400° C. The evaporating temperature may illustratively be the temperature that is necessary to make material that has been deposited on the carrier structure 1014a evaporate away from the carrier structure 1014a.

According to various embodiments, the carrier structure 1014a may be etched for the cleaning. For this purpose, the cleaning device 1004 may for example have an ion source 1004 (for example an ion beam source) or a plasma source 1004.

According to various embodiments, the carrier structure 1014a may be ground and/or blasted for the cleaning. For this purpose, the cleaning device 1004 may for example have an abrasive (for example abrasive particles or an abrasive brush). Illustratively, material that has been deposited on the carrier structure 1014a can be carried away by the mechanical action of the abrasive.

For the intensive cooling of the carrier structure 1014a (for example the transporting belt) in the returning region or after the cleaning region 1013, it may be necessary, depending on the application, to provide along with the cooling of the carrier structure 1014a by radiation of heat to the surroundings also a heat dissipation by thermal conduction and/or convection.

For transporting away the heat, for example a cooled plate in the cooling-down region 1013k may be brought up as close as possible to the carrier structure 1014a (for example to the transporting belt). Furthermore, it is also possible to bring a cooled roller into contact with the carrier structure 1014a (for example the transporting belt). Furthermore, a gas provided may improve thermal contact between the cooled roller and the carrier structure 1014a (for example the transporting belt).

If a cooled plate is intended to have been provided or to be provided at a close distance from the carrier structure 1014a, and mechanical contact between the cooled plate and the carrier structure 1014a is to be avoided, the cooled plate may for example have been equipped or be equipped with nozzles toward the carrier structure 1014a. In this way the cooling effect can be increased by an intensive flow of gas against the carrier structure 1014a, both by a provided primary gas, which flows out through the nozzles, and by induction of sucked-in gas, which is cooled by the intensive contact with the cooled plate and is fed to the carrier structure 1014a along with the primary flow. It may be advisable to suck the gas away again directly at the cooled plate (cooling plate).

Figure 6B:
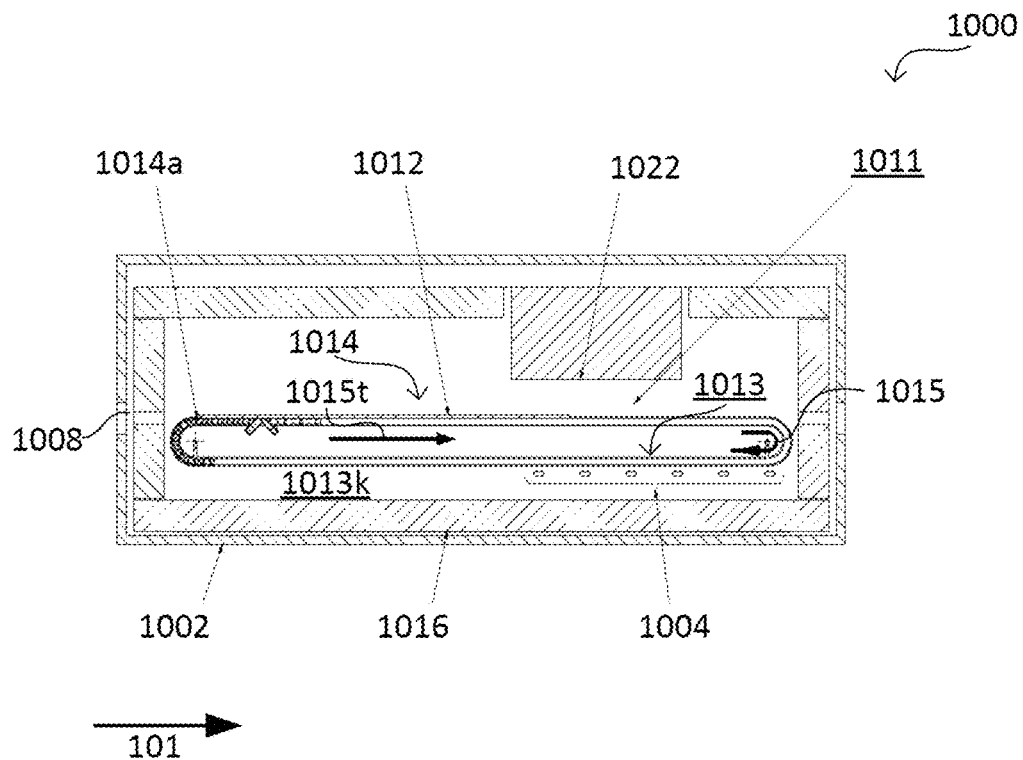
Figure 6C:
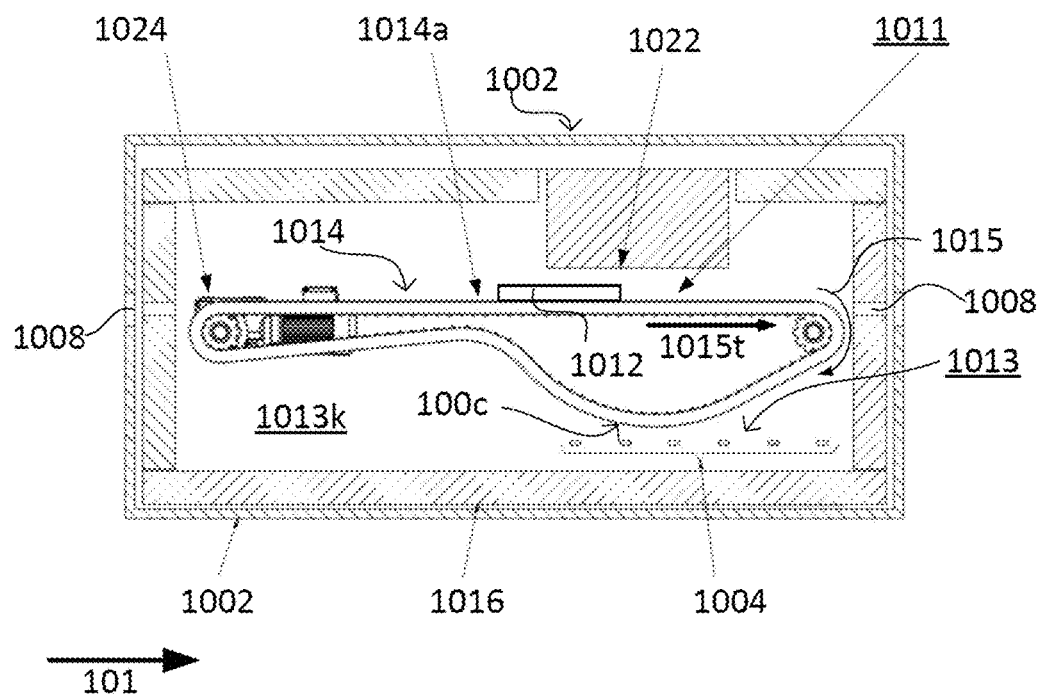

FIG. 6B and FIG. 6C illustrate in each case a processing arrangement 1000 in a schematic cross-sectional view, for example transversely in relation to a transporting direction 1015t, for example transversely in relation to a direction 101, according to various embodiments.

According to various embodiments, a radiant heater 1004 may have been arranged underneath the transporting device 1014. The radiant heater 1004 may have multiple heating elements 1004. The radiant heater may be set up in such a way that thermal radiation (for example infrared radiation) can be produced by the heating elements 1004 and emitted into the cleaning region 1013. Furthermore, thermal conduction and/or convection may also be produced by the radiant heater 1004. The thermal radiation may be produced and emitted in such a way that the carrier structure 1014a can be irradiated by the thermal radiation in the cleaning region 1013. The carrier structure 1014a may absorb part of the thermal radiation and thereby be heated up. In other words, the radiant heater 1004 may be set up in such a way that the carrier structure 1014a that is irradiated by the radiant heater 1004 can be heated up. Furthermore, the carrier structure 1014a may be heated up by thermal conduction and/or convection from the radiant heater 1004.

In other words, the radiant heater 1004 can be fed energy (for example electrical energy), wherein this heater can convert the energy fed to it into thermal radiation, and by the thermal radiation as an energy source can transfer part of the energy fed to it to the carrier structure 1014a in the cleaning region 1013, so that the carrier structure 1014a can be heated up. In this case, the effective range of the radiant heater 1004 may be confined to a small area of the carrier structure 1014a or of the transporting device 1014, for example the radiant heater 1004 may be focused (for example on a line transversely in relation to the transporting direction 1015t), so that a great amount of heat can be introduced locally into the carrier structure 1014a or the transporting device 1014 and material can be made to re-evaporate from the carrier structure 1014a or the transporting device 1014.

According to various embodiments, any desired suitable heating elements 1004 may have been arranged in the process chamber 1002 and be operated for heating the carrier structure 1014a or the transporting device 1014. According to various embodiments, a line heater 1004 or multiple line heaters 1004 may have been arranged or be arranged in the process chamber 1002 and be operated for heating the carrier structure 1014a or the transporting device 1014.

As described above, the process chamber 1002 may have a cooling-down region 1013k. Illustratively, the carrier structure 1014a heated up in the cleaning region 1013 may be passed on to the cooling-down region 1013k for cooling down. The cooling-down region 1013k may be dimensioned in such a way that the carrier structure 1014a moved through the cooling-down region 1013k can cool down to a temperature less than a predefined cooling temperature, for example to a temperature of less than 1000° C., for example to a temperature of less than 800° C., for example to a temperature of less than 600° C. The predefined cooling temperature may illustratively be a temperature to which the carrier structure 1014a is to be cooled down before a substrate can once again be transported through the processing region 1011 by the cooled-down carrier structure 1014a.

In this way it is possible for example to prevent that a substrate 1012 transported by the carrier structure 1014a is heated up too much by the carrier structure 1014a. Otherwise, the coating of the substrate 1012 could be impaired, since the substrate 1012 would be at too high a temperature.

Illustratively, the cooling-down region 1013k may act as a cooling-down section, wherein a temperature of the carrier structure 1014a can decrease as the carrier structure 1014a moves along the cooling-down section. Furthermore, the cooling-down region 1013k may be set up in such a way that, after passing through the cooling-down region, the carrier structure 1014a is at substantially the same temperature as a substrate to be processed that is intended to be processed by the carrier structure 1014a in the processing region 1011. Furthermore, the cooling-down region 1013k may be set up in such a way that, after passing through the cooling-down region, the carrier structure 1014a is at substantially the same temperature as may be required for coating the substrate in the processing region 1011.

Furthermore, a thermal insulation 1016 may have been arranged or be arranged in the process chamber 1002. The thermal insulation 1016 may be set up in such a way that heating up of the chamber housing 1006 can be reduced. The thermal insulation 1016 may furthermore be set up in such a way that heating up of the carrier structure 1014a in the cleaning region 1013 can take place as effectively as possible. Furthermore, the thermal insulation 1016 may be set up in such a way that for example part of the transporting device, for example the drive, may have been protected or be protected from excessive thermal loading.

According to various embodiments, the thermal insulation 1016 may include a thermally insulating material or an evacuated hollow body. In this way it can be achieved for example that heat transfer through the thermal insulation 1016 is as low as possible.

According to various embodiments, the thermal insulation 1016 may have a coating that has been set up in such a way that this thermal radiation is reflected. In this way it can be achieved for example that the thermal insulation 1016 illustratively absorbs as little thermal radiation as possible, and consequently is heated up as little as possible. Furthermore, in this way it can be achieved for example that thermal radiation re-emitted from the heated-up carrier structure 1014a in the cleaning region 1013 can be reflected in the direction of the carrier structure 1014a, so that the heating up of the carrier structure 1014a in the cleaning region 1013 takes place as effectively as possible.

In order to assist cooling down of the carrier structure 1014a in the cooling-down region 1013k, part (for example the part bounding the cooling-down region 1013k) of the thermal insulation 1016 may be set up in such a way that thermal radiation emitted from the carrier structure 1014a in the cooling-down region 1013k is re-emitted and/or reflected as little as possible again to the carrier structure 1014a in the cooling-down region 1013k. Illustratively, the thermal insulation 1016 can effectively transport away part of the thermal energy given off by thermal radiation by the carrier structure 1014a in the cooling-down region 1013k.

According to various embodiments, the heating up of the carrier structure 1014a in the cleaning region 1013 may take place by a line heater 1004. Illustratively, a line heater 1004 may be set up in such a way that a region heated up by the line heater 1004 is as small as possible. In this way it can be achieved for example that illustratively as little energy as possible is required for the cleaning of a carrier structure 1014a in the cleaning region 1013 and/or that the carrier structure 1014a is only heated up superficially, so that, although the deposited material can be made to evaporate from the carrier structure 1014a, the carrier structure 1014a can also cool down again quickly.

Furthermore, the heating up of the carrier structure 1014a in the cleaning region 1013 can take place locally by a line heater 1004, so that after the heating up a cooling down illustratively takes place as quickly as possible. In this way it can be achieved for example that a cooling region 1013k may be as small as possible or that there may be no need for a cooling region 1013k.

According to various embodiments, the transporting device 1014c (cf. FIG. 1A to FIG. 1U) may be set up in such a way that the sagging pushing/conveying region 100c is arranged in the cleaning region 1013. In this way it can be achieved for example that elements of the carrier structure 1014a that are located in the sagging pushing/conveying region 100c (for example bars, chain links, a portion of the transporting belt) can be cleaned by the cleaning device 1004. In this case, the sagging pushing/conveying region 100c may be set up in such a way that, as the carrier structure 1014a moves through the sagging pushing/conveying region 100c, a time period in which an element of the carrier structure 1014a is located in the cleaning region 1013 is great enough that the element of the carrier structure 1014a is cleaned sufficiently, for example is heated up sufficiently, that material deposited on the element of the carrier structure 1014a can be made to evaporate away. Furthermore, the carrier elements in the form of bars of the carrier structure 1014a of the transporting device 1014 may be partially separated from one another on account of the curved path of movement in the sagging pushing/conveying region 100c (for example a gap may be produced between respectively neighboring bars), so that the carrier structure 1014a can be cleaned effectively.

Figure 6D:
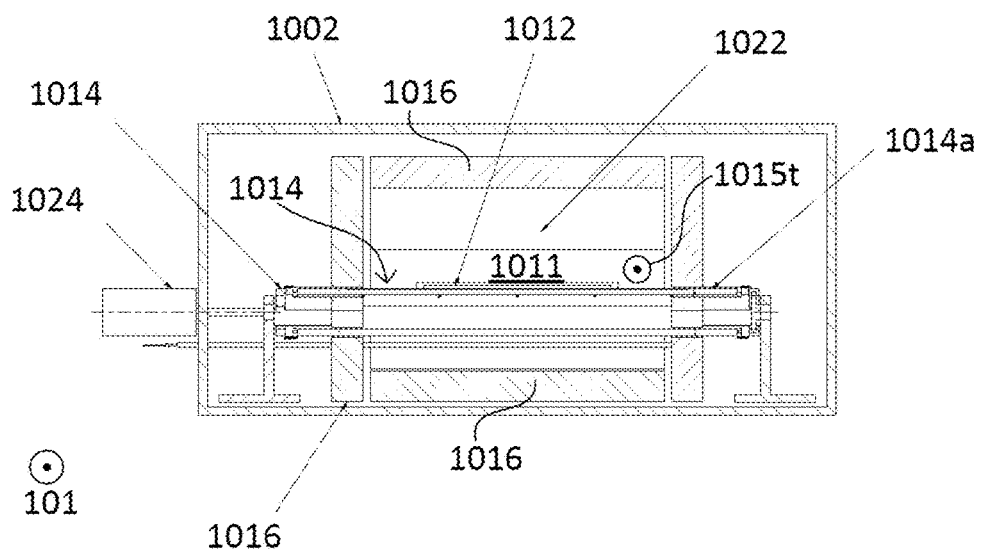

FIG. 6D illustrates the processing arrangement 1000 shown in FIG. 6A and FIG. 6C in a schematic cross-sectional view, for example from the transporting direction 1015t, for example from the direction 101.

As shown in FIG. 6D, the thermal insulation 1016 may have multiple thermal insulating wall elements 1016, which may have been arranged in such a way that the wall elements 1016 can bound or at least partially surround the processing region 1011. The thermally insulating wall elements 1016 may form a process tunnel, along which the substrate 1012 can be transported.

Figure 7:
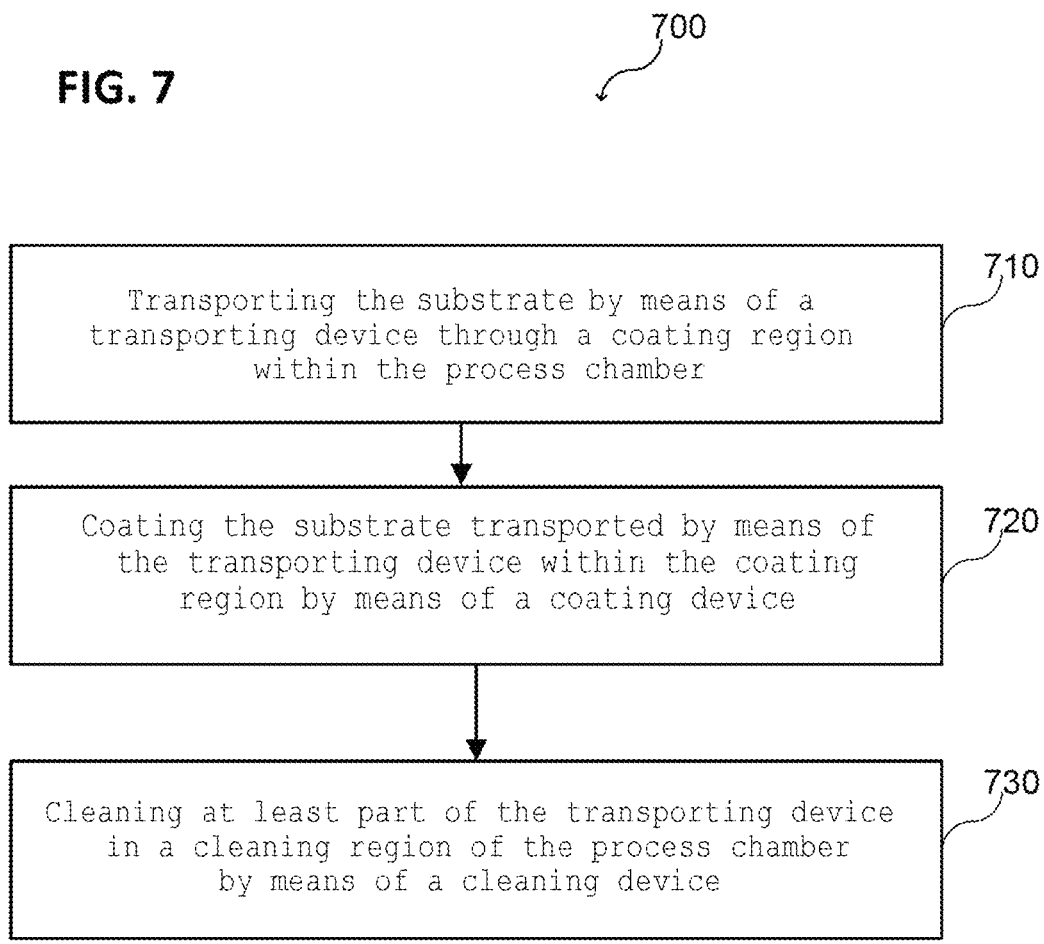
FIG. 7 shows a schematic flow diagram of a coating method, according to various embodiments.

FIG. 7 illustrates a coating method 700 for coating a substrate in a process chamber in a schematic flow diagram, according to various embodiments.

According to various embodiments, the coating method may include the following: in 710, transporting the substrate by a transporting device through a coating region within the process chamber; in 720, coating the substrate transported by the transporting device within the coating region by a coating device; and, in 730, cleaning at least a part or a portion of the transporting device (for example a carrier structure of the transporting device on which the substrate lies while the substrate is being transported through the coating region) in a cleaning region of the process chamber by a cleaning device.

According to various embodiments, a process chamber used in the coating method may be set up as described above, cf. for example FIGS. 6A to 6D.

According to various embodiments, the transporting of the substrate may take place by a carrier structure 1014a of the transporting device 1014, as for example described above.

Furthermore, the cleaning may include irradiating the transporting device in the cleaning region by a radiant heater. Furthermore, the cleaning may include heating up of the transporting device in the cleaning region by a heater.

Furthermore, the cleaning may include irradiating the carrier structure of the transporting device in the cleaning region by a radiant heater. Furthermore, the cleaning may include heating up of the carrier structure of the transporting device in the cleaning region by a heater.

For example, a portion of a transporting belt of the transporting device that is in each case located in the cleaning region may in each case be heated up by a heater. For example, at least one bar (or multiple bars) of the transporting device that is (are) in each case located in the cleaning region may in each case be heated up by a heater. For example, at least one slat (or multiple slats) of the transporting device that is (are) in each case located in the cleaning region may in each case be heated up by a heater.

Furthermore, the irradiation may include focusing a radiation emitted by the radiant heater, so that in each case the part of the transporting device that is to be heated up can be heated up locally.

According to various embodiments, the irradiation of the transporting device may take place in such a way that at least a region of the transporting device is heated up to a temperature of over approximately 500° C. (or to over approximately 600° C., or to over approximately 800° C., or to over approximately 1000° C.), so that material deposited on the region of the transporting device can be made to evaporate again.

Furthermore, the coating of the substrate transported by the transporting device within the coating region may be carried out in such a way that the substrates are coated at a high coating rate, for example at over approximately 1 µm·m/min, for example at over approximately 5 µm·m/min, for example at a coating rate in a range from approximately 1 µm·m/min to approximately 10 µm·m/min, while the respective substrate passes through the coating region of the process chamber at a predefined transporting speed. In this case, impairment of the transporting system by the cleaning can be prevented, or at least reduced or delayed for a time. Furthermore, contamination of the transporting device and/or other internal components in the process chamber can be prevented, or at least reduced or delayed for a time, on account of the closed substrate support that has been provided by the transporting device.

According to various embodiments, a transporting device 100 may have the following: a guiding rail arrangement with two guiding rails 108 for mounting a multiplicity of bars 107 between the two guiding rails. The two guiding rails 108 form a closed path of movement along which the multiplicity of bars 107 are pushed; the multiplicity of bars that are mounted in the guiding rail arrangement, a drive device for pushing at least one bar of the multiplicity of bars (for example in the case of a chain drive the bars that are in each case in engagement with teeth) in such a way that, in a transporting region 100t of the guiding rail arrangement, in each case multiple bars of the multiplicity of bars are pushed against one another and the bars that have been pushed against one another move along the path of movement in the transporting region 100t without any gaps.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A transporting device for transporting a substrate in a process chamber, the transporting device comprising:
    a guiding rail arrangement comprising two guiding rails for mounting a multiplicity of bars between the two guiding rails, wherein the two guiding rails form a closed path of movement along which the multiplicity of bars are guided;
    the multiplicity of bars are mounted in the guiding rail arrangement and each of the multiplicity of bars has a substantially rectangular prism shape; and a drive device for pushing at least one bar of the multiplicity of bars in such a way that, in a transporting region of the guiding rail arrangement, in each case multiple bars of the multiplicity of bars are pushed against one another and the bars that have been pushed against one another move along the path of movement in the transporting region.

2. The transporting device of claim 1,
wherein each bar of the multiplicity of bars has a rotatably mounted roller in each case at its two end portions; and
wherein the guiding rail arrangement has been set up in such a way that the bars of the multiplicity of bars are in each case mounted with the rotatably mounted rollers in the guiding rail arrangement.

3. The transporting device of claim 2,
wherein the guiding rails run in a straight line in the transporting region of the guiding rail arrangement.

4. The transporting device of claim 1,
wherein the guiding rail arrangement comprises a returning region, in which the bars of the multiplicity of bars in each case move along the path of movement, a first direction of movement of the respective bars in the returning region being directed counter to the direction of movement of the respective bars in the transporting region.

5. The transporting device of claim 4,
wherein the two guiding rails are set up in the returning region in such a way that the path of movement runs in a curved manner.

6. The transporting device of claim 1,
wherein the drive device has at least one chain wheel; and
wherein each bar of the multiplicity of bars has at least one engaging portion for engaging with the at least one chain wheel, by which each bar of the multiplicity of bars can be coupled with the drive device.

7. The transporting device of claim 1,
wherein each bar of the multiplicity of bars comprises at least one of carbon-fiber-reinforced carbon or a ceramic.

\* \* \* \* \*